US009245904B2

(12) United States Patent
Fukushima

(10) Patent No.: US 9,245,904 B2
(45) Date of Patent: Jan. 26, 2016

(54) ACTIVE MATRIX SUBSTRATE AND DISPLAY DEVICE INCLUDING THE SAME

(75) Inventor: Yasumori Fukushima, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 137 days.

(21) Appl. No.: 14/118,587

(22) PCT Filed: Jun. 15, 2012

(86) PCT No.: PCT/JP2012/003932
§ 371 (c)(1),
(2), (4) Date: Nov. 19, 2013

(87) PCT Pub. No.: WO2012/176417
PCT Pub. Date: Dec. 27, 2012

(65) Prior Publication Data
US 2014/0078458 A1    Mar. 20, 2014

(30) Foreign Application Priority Data

Jun. 24, 2011 (JP) ................................ 2011-139993

(51) Int. Cl.
*H01L 27/12* (2006.01)
*G02F 1/1333* (2006.01)
*G02F 1/1362* (2006.01)

(52) U.S. Cl.
CPC ...... *H01L 27/1218* (2013.01); *G02F 1/133305* (2013.01); *G02F 1/133345* (2013.01); *G02F 1/1362* (2013.01); *Y10T 428/2495* (2015.01)

(58) Field of Classification Search
CPC ............... G02F 1/133305; G02F 1/133345; G02F 1/1362; H01L 27/1218; Y10T 428/2495

USPC .......................................................... 349/158
See application file for complete search history.

(56) References Cited

U.S. PATENT DOCUMENTS

| 2006/0284179 | A1  | 12/2006 | Jung et al. |
| 2007/0090457 | A1* | 4/2007  | Lee et al. .................... 257/347 |
| 2008/0286498 | A1* | 11/2008 | Lin et al. ...................... 428/1.3 |
| 2009/0051640 | A1* | 2/2009  | Tanaka et al. ................. 345/92 |
| 2009/0153781 | A1* | 6/2009  | Otani et al. .................... 349/74 |

FOREIGN PATENT DOCUMENTS

| JP | 2004-354648 A | 12/2004 |
| JP | 2006-352119 A | 12/2006 |

OTHER PUBLICATIONS

Official Communication issued in International Patent Application No. PCT/JP2012/003932, mailed on Jul. 31, 2012.

* cited by examiner

*Primary Examiner* — Hoan C Nguyen
(74) *Attorney, Agent, or Firm* — Keating & Bennett, LLP

(57) ABSTRACT

The thickness of a rear surface-side inorganic film (9) formed from the same material as that of each of front surface-side inorganic films (11, 13, and 16) and provided at a rear surface side of a resin substrate (10) having a heat resistance is set in a predetermined range with respect to the total thickness of the front surface-side inorganic films (11, 13, and 16) so that the curvature diameter calculated based on the linear elastic modulus, the coefficient of linear expansion, and the thickness of the resin substrate (10); the linear elastic moduli, the coefficients of linear expansion, and the total thickness of the front surface-side inorganic films (11, 13, and 16); and the linear elastic modulus, the coefficient of linear expansion, and the thickness of the rear surface-side inorganic film (9) is 20 mm or more or −20 mm or less.

15 Claims, 20 Drawing Sheets

ACTIVE MATRIX SUBSTRATE AND DISPLAY DEVICE INCLUDING THE SAME

TECHNICAL FIELD

The present invention relates to an active matrix substrate and a display device including the same and, in particular, to an active matrix substrate using a resin substrate and a display device including the active matrix substrate.

BACKGROUND ART

A liquid crystal display device includes, for example, an active matrix substrate in which a thin film electrical element, such as a thin film transistor (hereinafter referred to as "TFT" in some cases), is provided in each sub-pixel which is the minimum unit of an image; a counter substrate provided so as to face the active matrix substrate; and a liquid crystal layer provided between the active matrix substrate and the counter substrate.

In recent years, in a display device such as a liquid crystal display device, instead of using a glass which has been used in the past, an active matrix substrate using a resin substrate has been proposed.

For example, Patent Literature 1 has disclosed a display device in which a main substrate on which active elements are formed is a laminate film including an insulating film formed of a resin material having a high heat resistance and a metal thin film formed of a metal or an alloy having a smaller coefficient of linear expansion than that of the insulating film, and the total number of the insulating film and the metal thin film is odd and at least three.

In addition, Patent Literature 2 has disclosed a silicon thin film transistor in which buffer layers are formed on two surfaces of a substrate, a silicon channel (silicon channel) is formed in a one buffer layer (located at one side), a gate insulating layer is formed on the silicon channel, and a gate is formed on the gate insulating layer.

CITATION LIST

Patent Literature

PTL 1: Japanese Unexamined Patent Application Publication No. 2004-354648
PTL 2: Japanese Unexamined Patent Application Publication No. 2006-352119

SUMMARY OF INVENTION

Technical Problem

Incidentally, when TFTs each using amorphous silicon are formed on a substrate, since a step of forming an insulating film and/or a semiconductor film is performed at a temperature of approximately 300° C. or more, for example, a resin substrate formed of a polyimide or the like having a high heat resistance is suitably used for the substrate on which TFTs are to be formed. In addition, for example, a polyimide-made resin substrate may be formed in such a way that after a solution containing an organic solvent, such as dimethylacetamide or N-methylpyrrolidone, and a polyamic acid, which is a precursor of a polyimide, dissolved in the solvent is applied to a surface of a supporting substrate, such as a glass substrate, the supporting substrate is heated to evaporate the organic solvent and at the same time to carry out an imidization reaction. Furthermore, the polyimide-made resin substrate may be separated from the supporting substrate, for example, in such a way that after TFTs are formed on the resin substrate formed on the surface of the supporting substrate, that is, on a coating film-forming surface thereof, laser light is irradiated from a rear surface side of the supporting substrate, and an ablation phenomenon caused by the laser light is used for the separation.

However, when the resin substrate on which TFTs and the like are formed, that is, when the active matrix substrate, is separated from the supporting substrate, for example, since the coefficient of linear expansion of the resin substrate is higher than that of an inorganic film formed thereon, the rate of contraction of the resin substrate obtained when a temperature of approximately 250° C. to 300° C. at which the inorganic film is formed is decreased to room temperature is higher than the rate of contraction of the inorganic film. As a result, the active matrix substrate is warped so that a front surface side thereof at which TFTs and the like are formed protrudes outside, and for example, the active matrix substrate may be curled up to form a roll shape having a diameter of approximately 2 mm or less in some cases. In the case described above, various problems may be liable to occur, and as the problems, for example, there may be mentioned defects of electrical connection between electronic components and terminals in a mounting step in which the electronic components, such as an FPC (Flexible Printed Circuit) and an IC (Integrated Circuit) chip, are mounted in a terminal region of the active matrix substrate; generation of mechanical stress in elements and wires formed in the active matrix substrate; flatness defects caused by undulation of surfaces of a display device; defects in which for example, air bubbles are liable to be trapped due to deteriorated workability in a lamination step which is performed to secure the rigidity and the reliability of a device; and connection defects caused by peeling which occurs at portions at which the active matrix substrate and a counter substrate are electrically connected to each other with a common transfer member interposed therebetween.

The present invention was made in consideration of the problems described above, and an object of the present invention is to suppress the warpage of an active matrix substrate using a resin substrate and to secure the workability of the active matrix substrate.

Solution to Problem

In order to overcome the problems described above, according to the present invention, a rear surface-side inorganic film having a thickness set in a predetermined range with respect to the total film thickness of a plurality of front surface-side inorganic films provided at a front surface side is provided at a rear surface side of a transparent resin substrate having a heat resistance.

Incidentally, the reason the active matrix substrate using a resin substrate is curled up is believed that at a manufacturing process temperature, the expansion and contraction of a material of the resin substrate is different from the expansion and contraction of a material of each insulating film provided on the resin substrate.

When two substrates which are different from each other are adhered to each other, and the temperature is changed, because of the difference in expansion and contraction between the substrates, the substrates are warped like a bimetal. In addition, when the size (the length and the width) of one substrate is equal to that of the other substrate, it has been believed that the warpage thus generated is determined by the following four parameters, that is, (1) the difference in temperature, (2) the coefficient of linear expansion of each substrate, (3) the modulus (Young's modulus) of each substrate, and (4) the thickness of each substrate.

The coefficient of linear expansion indicates the ratio of expansion and contraction per difference in temperature, and the modulus indicates the degree of difficulty to be bent when the identical force is applied; hence, when the modulus of one substrate is almost close to zero, even if there is a remarkable difference in coefficient of linear expansion, the warpage of the two substrates adhered to each other is dominantly determined by the modulus of the other substrate.

The following Table 1 shows examples of the coefficient of linear expansion and the linear elastic modulus (modulus) of various materials used for the active matrix substrate.

TABLE 1

|  | Coefficient of Linear Expansion (ppm/K) | Linear Elastic Modulus (GPa) |
| --- | --- | --- |
| Polyimide Resin | 50 | 4 |
| Acrylic Resin | 70 | 3 |
| SiNx | 2.3 | 290 |
| SiOx | 0.7 | 70 |
| Glass Substrate | 3.8 | 77 |

As shown in Table 1, the coefficient of linear expansion of the organic film (polyimide resin and acrylic resin) is several tens of times that of the inorganic film (SiNx and SiOx), and the modulus of the inorganic film (SiNx and SiOx) is several tens of times that of the organic film (polyimide resin and acrylic resin). Hence, although the expansion and contraction of the organic film is large with respect to the change in temperature, it is believed that since having a low rigidity and a high flexibility as compared to those of the inorganic film, the organic film is likely to follow the expansion and contraction of the inorganic film. In addition, it is also believed that since the inorganic film has a high rigidity as compared to that of the organic film, when being used in combination with the organic film, the inorganic film is liable to give an influence on the warpage of the substrate even if having a small thickness.

FIG. 1 is a cross-sectional view of an active matrix substrate 120 using a resin substrate 110 formed on a glass substrate 100. In addition, FIG. 2 is a simplified cross-sectional view of the active matrix substrate 120 shown in FIG. 1.

As shown in FIG. 1, the active matrix substrate 120 includes the resin substrate 110; an underlayer film 111 provided on the resin substrate 110: a gate electrode 112a and a capacity line 112b, each of which is provided on the underlayer film 111; a gate insulating film 113 provided so as to cover the gate electrode 112a and the capacity line 112b; a semiconductor layer 114 which is provided on the gate insulating film 113 and which is formed of an intrinsic amorphous silicon layer 114a and n⁺ amorphous silicon layers 114b; a source electrode 115a and a drain electrode 115b, each of which is provided on the semiconductor layer 114; a protective film 116 provided so as to cover the source electrode 115a and the drain electrode 115b; a resin-made planarizing film 117 provided so as to cover the protective film 116; and a pixel electrode 118 provided on the planarizing film 117.

In the active matrix substrate 120, it is believed that as members having influences on the warpage of the substrate, the resin substrate 110, the underlayer film 111, the gate insulating film 113, the protective film 116, and the planarizing film 117, each of which is provided on almost the entire surface of the substrate, are mentioned. Hence, when the underlayer film 111, the gate insulating film 113, and the protective film 116 are regarded as inorganic insulating films formed from the same material, the active matrix substrate 120, the warpage of which is to be investigated, may be simplified to have a laminate structure containing three layers, that is, the resin substrate 110, an inorganic film Fi, and an organic film Fo.

FIG. 3 is a perspective view of a model substrate B which is formed from three types of substrates adhered to each other in order to obtain a curvature radius of an active matrix substrate. As shown in FIG. 3, the length of the model substrate B is represented by L; the width thereof is represented by b; the linear elastic modulus, the coefficient of linear expansion, and the thickness of an upper-side first substrate $B_1$ are represented by $E_1$, $\alpha_1$, and $h_1$, respectively; the linear elastic modulus, the coefficient of linear expansion, and the thickness of an intermediate second substrate $B_2$ are represented by $E_2$, $\alpha_2$, and $h_2$, respectively; and the linear elastic modulus, the coefficient of linear expansion, and the thickness of a lower-side third substrate $B_3$ are represented by $E_3$, $\alpha_3$, and $h_3$, respectively. In addition, in FIG. 3, $A_1$, $A_2$, and $A_3$ represent the transverse cross-sectional areas of the first substrate $B_1$, the second substrate $B_2$, and the third substrate $B_3$, respectively.

In addition, FIG. 4 is a side view of the model substrate B. As shown in FIG. 4, $y_1$ indicates a positive coordinate axis in a downward direction when the upper surface of the first substrate $B_1$ is regarded as the origin, $y_n$ is a length from the upper surface of the first substrate $B_1$ to a plane (neutral axis N) which is not expanded nor contracted when the model substrate M is deformed, and y is a positive coordinate axis in a downward direction when the neutral axis N is regarded as the origin.

For example, as disclosed in "Composite Beam" of the reference literature (by Hiroshi MIYAMOTO and Masanori KIKUCHI, "Strength of Materials", published by Shokabo Publishing Co., Ltd., February 1987, p 106 to 109), $y_n$ can be obtained from the following equation 1.

[Math. 1]

$$y_n = \frac{\sum_{i=1}^{3} \int_{A_i} y_1 dA}{\sum_{i=1}^{3} E_i A_i}$$

$$= \frac{E_1 h_1^2 + E_2(h_2^2 + 2h_1 h_2) + E_3(h_3^2 + 2(h_1 + h_2)h_3)}{2(E_1 h_1 + E_2 h_2 + E_3 h_3)}$$

(Equation 1)

In addition, when the curvature diameter of the model substrate B is represented by ρ, and the bending moment in this case is represented by M, the following equation 2 holds.

[Math. 2]

$$\frac{1}{\rho} = \frac{M}{\sum_{i=1}^{3} E_i I_i}$$

(Equation 2)

Since $I_i$ of Equation 2 indicates a cross-sectional secondary moment of a cross section $A_i$ about the neutral axis, the following equation 3 holds.

[Math. 3]

$$I_i = \int_{A_i} y^2 dA$$

(Equation 3)

In particular, $I_1$, $I_2$, and $I_3$ are represented by the following equations 4, 5, and 6, respectively.

[Math. 4]
$$I_1 = \int_{A_1} y^2 dA = b \int_{-y_n}^{h_1-y_n} y^2 dy \quad \text{(Equation 4)}$$

[Math. 5]
$$I_2 = \int_{A_2} y^2 dA = b \int_{h_1-y_n}^{h_1+h_2-y_n} y^2 dy \quad \text{(Equation 5)}$$

[Math. 6]
$$I_3 = \int_{A_3} y^2 dA = b \int_{h_1+h_2-y_n}^{h_1+h_2+h_3-y_n} y^2 dy \quad \text{(Equation 6)}$$

Accordingly, as represented by the following equation 7, the denominator of the right term of Equation 2 can be obtained.

[Math. 7]
$$\sum_{i=1}^{3} E_i I_i = E_1 I_1 + E_2 I_2 + E_3 I_3 \quad \text{(Equation 7)}$$

$$= \frac{E_1 b h_1}{12(E_1 h_1 + E_2 h_2 + E_3 h_3)^2}(E_1^2 h_1^4 + 3E_2^2 h_2^4 +$$
$$2E_2^2 h_1 h_2^3 + 4E_2^2 h_1^2 h_2 + 4E_2^2 h_1^3 h_2 + 3E_3^2 h_3^4 +$$
$$16E_3^2 h_2^2 h_3^2 + 8E_3^2 h_2 h_3^3 + 6E_3^2 h_1 h_3^3 + 16E_3^2 h_1 h_2 h_3^2 +$$
$$4E_3^2 h_1^2 h_3^2 + 2E_1 E_2 h_1^2 h_2 + 6E_2 E_3 h_2^2 h_3^2 +$$
$$12E_2 E_3 h_2^3 h_3^2 + 6E_2 E_3 h_1 h_2 h_3^2 + 16E_2 E_3 h_1 h_2^2 h_3 +$$
$$8E_2 E_3 h_1^2 h_2 h_3 + 2E_1 E_3 h_1^3 h_3) +$$

$$\frac{E_2 b h_2}{12(E_1 h_1 + E_2 h_2 + E_3 h_3)^2}(3E_1^2 h_1^4 + 6E_1^2 h_1^3 h_2 +$$
$$4E_1^2 h_1^2 h_2^2 + E_2^2 h_2^4 + 3E_3^2 h_3^4 + 4E_3^2 h_2^2 h_3^2 + 6E_3^2 h_2 h_3^3 +$$
$$2E_1 E_2 h_1 h_2^3 + 2E_2 E_3 h_2^3 h_3 - 6E_1 E_3 h_1 h_2 h_3^2 -$$
$$4E_1 E_3 h_1 h_2 h_3^2 - 6E_1 E_3 h_1^2 h_2 h_3 - 6E_1 E_3 h_1^2 h_3^2) +$$

$$\frac{E_3 b h_3}{12(E_1 h_1 + E_2 h_2 + E_3 h_3)^2}(4E_1^2 h_1^2 h_3^2 + 6E_1^2 h_1^3 h_3 +$$
$$12E_1^2 h_1^2 h_2 + 3E_1^2 h_1^4 + 12E_1^2 h_1^2 h_2^2 + 12E_1^2 h_1^3 h_2 +$$
$$4E_2^2 h_2^2 h_3^2 + 6E_2^2 h_2^3 h_3 + 3E_2^2 h_2^4 + 3E_3^2 h_3^4 +$$
$$8E_1 E_2 h_1 h_2 h_3^2 + 18E_1 E_2 h_1 h_2^2 h_3 + 6E_1 E_2 h_1^2 h_2 h_3 +$$
$$6E_1 E_2 h_1^2 h_2^2 + 12E_1 E_2 h_1 h_2^3 + 2E_2 E_3 h_2 h_3^3 +$$
$$2E_1 E_3 h_1 h_3^3)$$

The bending moment M can be obtained by the following equation 8.

[Math. 8]
$$M = \sum_{i=1}^{3} \int_{A_i} \sigma_i y \, dA \quad \text{(Equation 8)}$$

In the above equation, $\sigma_i$ indicates a stress generated in each of the first substrate $B_1$, the second substrate $B_2$, and the third substrate $B_3$.

FIG. 5 is an explanatory view showing the expansion of each substrate when the first substrate $B_1$, the second substrate $B_2$, and the third substrate $B_3$, which form the model substrate B, are not adhered to each other.

As shown in FIG. 5, when the first substrate $B_1$, the second substrate $B_2$, and the third substrate $B_3$, which form the model substrate B, are not adhered to each other, by a temperature difference t, the first substrate $B_1$, the second substrate $B_2$, and the third substrate $B_3$ are expanded by $\alpha_1 Lt$, $\alpha_2 Lt$, and $\alpha_2 Lt$, respectively, in proportion to the coefficient of linear expansion of each substrate.

However, since the first substrate $B_1$, the second substrate $B_2$, and the third substrate $B_3$ are adhered to each other, the first substrate $B_1$, the second substrate $B_2$, and the third substrate $B_3$ have the same expansion $\delta$, and a stress $\sigma_i$ generated thereby is represented by the following equation 9.

$$\sigma_i = E_i(\alpha_i Lt - \delta)/L \quad \text{(Equation 9)}$$

In addition, since the total of the forces generated by the stresses of the first substrate $B_1$, the second substrate $B_2$, and the third substrate $B_3$ is canceled out at the same expansion $\delta$, the following equation 10 holds.

$$\sigma_1 b h_1 + \sigma_2 b h_2 + \sigma_3 b h_3 = 0 \quad \text{(Equation 10)}$$

Next, when Equation 9 is substituted in Equation 10 and is then modified, the following equation holds.

$$\delta = (E_1 \alpha_1 h_1 + E_2 \alpha_2 h_2 + E_3 \alpha_3 h_3)/(E_1 h_1 + E_2 h_2 + E_3 h_3) \times Lt$$

When the above equation is substituted in Equation 9, the stress $\sigma_i$ is represented by the following equation 11.

$$\sigma_i = E_i\{\alpha_i - (E_1 \alpha_1 h_1 + E_2 \alpha_2 h_2 + E_3 \alpha_3 h_3)/(E_1 h_1 + E_2 h_2 + E_3 h_3)\}/t \quad \text{(Equation 11)}$$

In particular, the bending moment M is represented by the following equation 12.

[Math. 9]
$$M = \int_{-y_n}^{h_1-y_n} \sigma_1 b y \, dy + \int_{h_1-y_n}^{h_1-h_2-y_n} \sigma_2 b y \, dy + \int_{h_1+h_2-y_n}^{h_1+h_2+h_3-y_n} \sigma_3 b y \, dy \quad \text{(Equation 12)}$$

$$= \frac{b\sigma_1}{2} h_1(h_1 - 2y_n) + \frac{b\sigma_2}{2} h_2\{h_2 + 2(h_1 - y_n)\} +$$
$$\frac{b\sigma_3}{2} h_3\{h_3 + 2(h_1 + h_2 - y_n)\}$$

Next, when Equation 1 is substituted in Equation 12, the bending moment M is represented by the following equation 13.

[Math. 10]
$$M = \frac{b}{4(E_1 h_1 + E_2 h_2 E_3 h_3)} \quad \text{(Equation 13)}$$
$$\{\sigma_1(-2E_2 h_1 h_2^2 - 2E_3 h_1 h_3^2 - 2E_2 h_1^2 h_2 -$$
$$2E_3 h_1^2 h_3 - 4E_3 h_1 h_2 h_3) +$$
$$\sigma_2(2E_2 h_1^2 h_2 - 2E_3 h_2 h_3^2 + 2E_1 h_1 h_2^2 - 2E_3 h_2^2 h_3) +$$
$$\sigma_3(2E_1 h_1^2 h_3 + 2E_2 h_2^2 h_3 +$$
$$2E_1 h_1 h_3^2 + 2E_2 h_2 h_3^2 + 4E_1 h_1 h_2 h_3)\}$$

Accordingly, in the model substrate B, based on the temperature difference t, the physical properties (the linear elastic modulus $E_i$ and the coefficient of linear expansion $\alpha_i$) of each substrate, and the thickness $h_i$ thereof, the curvature diameter $\rho$ can be calculated in a material mechanics manner. In addition, although the case in which the model substrate is formed of three layers has been described by way of example, even if the structure is formed of four layers or more, the curvature diameter p thereof can also be calculated based on the idea similar to that described above.

In FIG. 2, the case is assumed in which the resin substrate 110 is formed of a polyimide resin having a thickness of 10 μm, the underlayer film 111 is formed of a silicon nitride film having a thickness of 250 nm, the gate insulating film 113 is formed of a silicon nitride film having a thickness of 400 nm, the protective film 116 is formed of a silicon nitride film having a thickness of 250 nm, and the planarizing film 117 is formed of an acrylic resin having a thickness of 2.5 μm, that is, the case is assumed in which a model substrate is formed to have a laminate structure including a polyimide film having a thickness of 10 μm, a silicon nitride film having a thickness of 900 nm, and an acrylic resin film having a thickness of 2.5 μm. In addition, when a process temperature is set to 200° C. to 300° C. in the case described above, the curvature diameter calculated therefrom is approximately 0.6 to 0.9 mm, and this calculated value coincides with the degree in which an actual active matrix substrate is curled up; hence, the method for calculating a curvature diameter based on the model substrate described above may be regarded as a reasonable method.

In particular, an active matrix substrate of the present invention includes a resin substrate having a heat resistance, thin film electrical elements provided at a front surface side of the resin substrate, a plurality of front surface-side inorganic films which are formed from the same material and which are provided as different layers from each other at the front surface side of the resin substrate, and a rear surface-side inorganic film which is formed from the same material as that of the front surface-side inorganic films and which is provided at a rear surface side of the resin substrate. In addition, the thickness of the rear surface-side inorganic film is set in a predetermined range with respect to the total thickness of the plurality of front surface-side inorganic films so that the curvature diameter calculated based on the linear elastic modulus, the coefficient of linear expansion, and the thickness of the resin substrate; the linear elastic moduli, the coefficients of linear expansion, and the total thickness of the plurality of front surface-side inorganic films; and the linear elastic modulus, the coefficient of linear expansion, and the thickness of the rear surface-side inorganic film is (+)20 mm or more or −20 mm or less.

In addition, although the curvature diameter basically has a positive value, a positive and a negative sign indicate the curving direction.

According to the structure described above, since the rear surface-side inorganic film is provided at the rear surface side of the transparent resin substrate having a heat resistance, the warpage of the active matrix substrate caused by the plurality of front surface-side inorganic films provided at the front surface side is compensated for. In this case, as described above, the curvature diameter of the active matrix substrate is calculated based on the linear elastic modulus, the coefficient of linear expansion, and the thickness of the resin substrate; the linear elastic moduli, the coefficients of linear expansion, and the total thickness of the plurality of front surface-side inorganic films; and the linear elastic modulus, the coefficient of linear expansion, and the thickness of the rear surface-side inorganic film by using Equations 2, 7, 11, and 13. In addition, since the thickness of the rear surface-side inorganic film is set in a predetermined range with respect to the total thickness of the plurality of front surface-side inorganic films so that the calculated curvature diameter of the active matrix substrate is 20 mm or more or −20 mm or less, the workability of the active matrix substrate can be secured. Hence, the warpage of the active matrix substrate using a resin substrate can be suppressed, and as a result, the workability of the active matrix substrate can be secured.

When the resin substrate is formed of a polyimide resin, the front surface-side inorganic films are each formed of a silicon nitride film, and the total thickness of the plurality of front surface-side inorganic films is represented by $X_a$ μm, a thickness $Y_a$ μm of the rear surface-side inorganic film may satisfy the following relational expression.

$$-0.1263X_a^2+0.674X_a+0.0733 \leq Y_a \leq 25.321X_a^3-49.8X_a^2+34.76X_a-7.355$$

FIG. 6 is a graph showing the relationship between the curvature diameter of the active matrix substrate and the thickness of the rear surface-side inorganic film formed of a silicon nitride film which is obtained when the front surface-side inorganic films are formed from a silicon nitride film to have a thickness of 0.9 μm, and when the resin substrate is formed from a polyimide resin to have a thickness of 5, 10, 20, and 50 μm. In the graph shown in FIG. 6, a curve a indicates the case of a thickness of 5 μm, a curve b indicates the case of a thickness of 10 μm, a curve c indicates the case of a thickness of 20 μm, and a curve d indicates the case of a thickness of 50 μm. In addition, when the curvature diameter has a negative value, the active matrix substrate warps to form an upward convex shape, and when the curvature diameter has a positive value, the active matrix substrate warps to form a downward convex shape. Furthermore, as one calculation example of the curvature diameter, when the linear elastic modulus $E_1$ is 290 GPa, the coefficient of linear expansion $\alpha_1$ is 2.3 ppm/K, the thickness $h_1$ is 0.9 μm, the linear elastic modulus $E_2$ is 4 GPa, the coefficient of linear expansion $\alpha_2$ is 50 ppm/K, the thickness $h_2$ is 10 μm, the linear elastic modulus $E_3$ is 290 GPa, the coefficient of linear expansion $\alpha_3$ is 2.3 ppm/K, and the thickness $h_3$ is 0.60 μm, the curvature diameter $\rho$ is −22.6 mm.

According to FIG. 6, it is understood that the range of the thickness of the rear surface-side inorganic film in which the curvature diameter of the active matrix substrate is 20 mm or more or −20 mm or less is not so much changed by the thickness of the resin substrate.

In addition, FIG. 7 is a graph showing the relationship between the curvature diameter of the active matrix substrate and the thickness of the rear surface-side inorganic film formed of a silicon nitride film which is obtained when the resin substrate is formed from a polyimide resin to have a thickness of 10 μm, and when the front surface-side inorganic films are formed from a silicon nitride film to have a thickness of 0.5, 0.7, 0.9, 1.2, and 1.5 μm. In the graph shown in FIG. 7, a curve a indicates the case of a thickness of 0.5 μm, a curve b indicates the case of a thickness of 0.7 μm, a curve c indicates the case of a thickness of 0.9 μm, a curve d indicates the case of a thickness of 1.2 μm, and a curve e indicates the case of a thickness of 1.5 μm.

According to FIG. 7, it is understood that the range of the thickness of the rear surface-side inorganic film in which the curvature diameter of the active matrix substrate is 20 mm or more or −20 mm or less is changed by the thicknesses of the front surface-side inorganic films each formed of a silicon nitride film.

FIG. 8 is a graph showing the relationship between the thickness $Y_a$ of the rear surface-side inorganic film and the total thickness $X_a$ of the plurality of front surface-side inorganic films at which the curvature diameter of the active matrix substrate is 20 mm. In addition, in FIG. 8, a circle mark indicates the upper limit at which the curvature diameter of the active matrix substrate is 20 mm, and a triangle mark indicates the lower limit at which the curvature diameter of the active matrix substrate is 20 mm.

According to FIG. 8, it is understood that the thickness $Y_a$ of the rear surface-side inorganic film at which the curvature diameter of the active matrix substrate is 20 mm or more and −20 mm or less has a predetermined correlation represented by a polynomial equation with the total thickness $X_a$ of the plurality of front surface-side inorganic films.

In particular, the curve a formed by connection between the circle marks shown in FIG. 8 is approximated by the following equation.

$$Y_a = 25.321 X_a^3 - 49.8 X_a^2 + 34.76 X_a - 7.355$$

In addition, the curve b formed by connection between the triangle marks shown in FIG. 8 is approximated by the following equation.

$$Y_a = -0.1263 X_a^2 + 0.674 X_a + 0.0733$$

Hence, when the thickness $Y_a$ of the rear surface-side inorganic film satisfies the following relational expression with respect to the total thickness $X_a$ of the front surface-side inorganic films, the curvature diameter of the active matrix substrate is set to 20 mm or more or −20 mm or less.

$$-0.1263 X_a^2 + 0.674 X_a + 0.0733 \leq Y_a \leq 25.321 X_a^3 - 49.8 X_a^2 + 34.76 X_a - 7.355$$

According to the structure described above, when the resin substrate is formed of a polyimide resin, the front surface-side inorganic films are each formed of a silicon nitride film, and the total thickness of the plurality of front surface-side inorganic films is represented by $X_a$ μm, since the thickness $Y_a$ μm of the rear surface-side inorganic film satisfies the following relational expression, based on the results of the simulations shown in FIGS. 6 and 7, the curvature diameter of the active matrix substrate is set to 20 mm or more or −20 mm or less, and in particular, the workability of the active matrix substrate is secured.

$$-0.1263 X_a^2 + 0.674 X_a + 0.0733 \leq Y_a \leq 25.321 X_a^3 - 49.8 X_a^2 + 34.76 X_a - 7.355$$

At the front surface side of the resin substrate, a front surface-side resin film for planarizing a substrate surface may also be provided.

According to the structure described above, since the front surface-side resin film for planarizing a substrate surface is provided at the front surface side of the resin substrate, in a liquid crystal display device including the active matrix substrate, the orientation of a liquid crystal layer is suppressed from being disturbed.

A rear surface-side resin film having a heat resistance may be provided at the rear surface side of the resin substrate, and the thickness of the above rear surface-side resin film may be set in a predetermined range with respect to the thickness of the front surface-side resin film so that the curvature diameter calculated based on the linear elastic modulus, the coefficient of linear expansion, and the thickness of the resin substrate; the linear elastic moduli, the coefficients of linear expansion, and the total thickness of the plurality of front surface-side inorganic films; the linear elastic modulus, the coefficient of linear expansion, and the thickness of the rear surface-side inorganic film; the linear elastic modulus, the coefficient of linear expansion, and the thickness of the front surface-side resin film; and the linear elastic modulus, the coefficient of linear expansion, and the thickness of the rear surface-side resin film is 20 mm or more or −20 mm or less.

According to the structure described above, since the rear surface-side resin film is provided at the rear surface side of the transparent resin substrate having a heat resistance, the warpage of the active matrix substrate caused by the front surface-side resin film provided at the front surface side can be compensated for. In this case, as described above, the curvature diameter of the active matrix substrate is calculated based on the linear elastic modulus, the coefficient of linear expansion, and the thickness of the resin substrate; the linear elastic moduli, the coefficients of linear expansion, and the total thickness of the plurality of front surface-side inorganic films; the linear elastic modulus, the coefficient of linear expansion, and the thickness of the rear surface-side inorganic film; the linear elastic modulus, the coefficient of linear expansion, and the thickness of the front surface-side resin film; and the linear elastic modulus, the coefficient of linear expansion, and the thickness of the rear surface-side resin film using Equations 2, 7, 11, and 13. In addition, since the thickness of the rear surface-side resin film is set in a predetermined range with respect to the thickness of the front surface-side resin film so that the calculated curvature diameter of the active matrix substrate is 20 mm or more or −20 mm or less, the workability of the active matrix substrate is secured. Hence, the warpage of the active matrix substrate using a resin substrate is suppressed, and as a result, the workability of the active matrix substrate can be secured.

When the front surface-side resin film is formed from an acrylic resin to have a thickness of $X_b$ μm, the rear surface-side resin film is formed from a polyimide resin to have a thickness of $Y_b$ μm, and the total thickness of the resin substrate, the front surface-side inorganic films, and the rear surface-side inorganic film is represented by $X_c$ μm, the thickness $Y_b$ of the rear surface-side resin film may satisfy the following relational expression.

$$(-0.045 X_b^2 + 1.4939 X_b - 1.9462)(-0.0348 X_c^2 + 0.1518 X_c + 1.4817) \leq Y_b \leq (0.0173 X_b^2 + 0.8303 X_b + 1.4109)(0.0073 X_c^2 - 0.0011 X_c + 0.7038)$$

FIG. 9 is a graph showing the relationship between the curvature diameter of the active matrix substrate and the thickness of the rear surface-side resin film formed of an acrylic resin which is obtained when the front surface-side resin film is formed from an acrylic resin to have a thickness of 2.5 μm, and when the resin substrate formed from a polyimide resin to have a thickness of 10 μm is replaced by a silicon nitride substrate having a thickness of 4.7 μm. In this graph shown in FIG. 9, a curve a indicates the case in which the resin substrate is formed from a polyimide resin to have a thickness of 10 μm, and a curve b indicates the case of a silicon nitride substrate having a thickness of 4.7 μm.

As apparent from FIG. 9, since the curve a almost coincides with the curve b, for the sake of convenience, the resin substrate formed from a polyimide resin to have a thickness of 10 μm may be replaced by a silicon nitride substrate having a thickness of 4.7 μm.

In addition, FIG. 10 is a graph showing the relationship between the curvature diameter of the active matrix substrate and the thickness of the rear surface-side resin film formed of a polyimide resin which is obtained when the resin substrate formed from a polyimide resin to have a thickness of 10 μm is replaced by a silicon nitride substrate having a thickness of 4.7 μm, the plurality of front surface-side inorganic films is formed from a silicon nitride film to have a thickness of 0.9 mm, and the rear surface-side inorganic film is formed from a silicon nitride film to have a thickness of 0.9 μm, that is, the resin substrate, the front surface-side inorganic films, and the rear surface-side inorganic film are collectively formed from a silicon nitride film to have a thickness of 6.5 μm, and when the thickness of the front surface-side resin film formed of an acrylic resin is changed to 1.0, 1.5, 2.0, 2.5, 3.0, 4.0, and 5.0 μm. In FIG. 10, a curve a indicates the case of a thickness of 1.0 μm, a curve b indicates the case of a thickness of 1.5 μm, a curve c indicates the case of a thickness of 2.0 µm, a curve d indicates the case of a thickness of 2.5 µm, a curve e indicates the case of a thickness of 3.0 µm, a curve f indicates the case of a thickness of 4.0 µm, and a curve g indicates the case of a thickness of 5.0 µm.

According to FIG. 10, it is understood that the range of the thickness of the rear surface-side resin film in which the curvature diameter of the active matrix substrate is 20 mm or more or −20 mm or less is changed by the thickness of the front surface-side resin film formed of an acrylic resin.

FIG. 11 is a graph showing the relationship between the thickness $Y_b$ of the rear surface-side resin film and the thickness $X_b$ of the front surface-side resin film at which the curvature diameter of the active matrix substrate is 20 mm. In addition, in FIG. 11, a circle mark indicates the upper limit at which the curvature diameter of the active matrix substrate is 20 mm, and a triangle mark indicates the lower limit at which the curvature diameter of the active matrix substrate is 20 mm.

According to FIG. 11, it is understood that the thickness $Y_b$ of the rear surface-side resin film at which the curvature diameter of the active matrix substrate is 20 mm or more and −20 mm or less has a predetermined correlation represented by a polynomial equation with the thickness $X_b$ of the front surface-side resin film.

In particular, a curve a obtained by connection between the circle marks in FIG. 11 is approximated by the following equation.

$$Y_b = 0.0173 X_b^2 + 0.8303 X_b + 1.4109$$

In addition, a curve b obtained by connection between the triangle marks in FIG. 11 is approximated by the following equation.

$$Y_b = -0.045 X_b^2 + 1.4939 X_b - 1.9462$$

Accordingly, when the total thickness of the resin substrate, the front surface-side inorganic films, and the rear surface-side inorganic film is set to 6.5 µm, if the thickness $Y_b$ of the rear surface-side resin film satisfies the following relational expression with respect to the thickness $X_b$ of the front surface-side resin film, the curvature diameter of the active matrix substrate is set to 20 mm or more or −20 mm or less.

$$-0.045 X_b^2 + 1.4939 X_b - 1.9462 \leq Y_b \leq 0.0173 X_b^2 + 0.8303 X_b + 1.4109$$

Furthermore, FIG. 12 is a graph showing the relationship between the curvature diameter of the active matrix substrate and the thickness of the rear surface-side resin film formed of a polyimide resin which is obtained when the front surface-side resin film is formed from an acrylic resin to have a thickness of 2.5 µm, and the resin substrate, the front surface-side inorganic films, and the rear surface-side inorganic film are collectively formed from a silicon nitride film to have a thickness of 4.0, 5.0, 6.5, 8.0, and 10.0 µm. In this graph shown in FIG. 12, a curve a indicates the case of a thickness of 4.0 µm, a curve b indicates the case of a thickness of 5.0 µm, a curve c indicates the case of a thickness of 6.5 µm, a curve d indicates the case of a thickness of 8.0 µm, and a curve e indicates the case of a thickness of 10.0 µm.

According to FIG. 12, it is understood that the range of the thickness of the rear surface-side resin film in which the curvature diameter of the active matrix substrate is 20 mm or more or −20 mm or less is changed by the total thickness of the resin substrate, the front surface-side inorganic films, and the rear surface-side inorganic film.

FIG. 13 is a graph showing the relationship between the thickness $Y_b$ of the rear surface-side resin film and the total thickness $X_c$ of the resin substrate, the front surface-side inorganic films, and the rear surface-side inorganic film at which the curvature diameter of the active matrix substrate is 20 mm. In addition, in FIG. 13, a circle mark indicated the upper limit at which the curvature diameter of the active matrix substrate is 20 mm, and a triangle mark indicates the lower limit at which the curvature diameter of the active matrix substrate is 20 mm.

According to FIG. 13, it is understood that the thickness $Y_b$ of the rear surface-side resin film at which the curvature diameter of the active matrix substrate is 20 mm or more and −20 mm or less has a predetermined correlation represented by a polynomial equation with the total thickness $X_c$ of the resin substrate, the front surface-side inorganic films, and the rear surface-side inorganic film.

In particular, a curve a obtained by connection between the circle marks in FIG. 13 is approximated by the following equation.

$$Y_b = 0.0261 X_c^2 - 0.0039 X_c + 2.5336$$

In addition, a curve b obtained by connection between the triangle marks in FIG. 13 is approximated by the following equation.

$$Y_b = -0.0522 X_c^2 + 0.2277 X_c + 2.2226$$

Accordingly, when the thickness $Y_b$ of the rear surface-side resin film satisfies the following relational expression with respect to the total thickness $X_c$ of the resin substrate, the front surface-side inorganic films, and the rear surface-side inorganic film, the curvature diameter of the active matrix substrate is set to 20 mm or more or −20 mm or less.

$$-0.0522 X_c^2 + 0.2277 X_c + 2.2226 \leq Y_b \leq 0.0261 X_c^2 - 0.0039 X_c + 2.5336$$

FIG. 14 is a graph obtained by transformation (normalization) of the graph shown in FIG. 13 so that when the total thickness $X_c$ of the resin substrate, the front surface-side inorganic films, and the rear surface-side inorganic film is 6.5 µm, the thickness of the rear surface-side resin film is set to 1.

In addition, a curve a obtained by connection between the circle marks in FIG. 14 is approximated by the following equation.

$$Y_b = 0.0073 X_c^2 - 0.0011 X_c + 0.7038$$

In addition, a curve b obtained by connection between the triangle marks in FIG. 14 is approximated by the following equation.

$$Y_b = -0.0348 X_c^2 + 0.1518 X_c + 1.4817$$

Accordingly, when the thickness $Y_b$ of the rear surface-side resin film satisfies the following relational expression with respect to the thickness $X_b$ of the front surface-side resin film and the total thickness $X_c$ of the resin substrate, the front surface-side inorganic films, and the rear surface-side inorganic film, the curvature diameter of the active matrix substrate is set to 20 mm or more or −20 mm or less.

$$(-0.045 X_b^2 + 1.4939 X_b - 1.9462)(-0.0348 X_c^2 + 0.1518 X_c + 1.4817) \leq Y_b \leq (0.0173 X_b^2 + 0.8303 X_b + 1.4109)(0.0073 X_c^2 - 0.0011 X_c + 0.7038)$$

According to the structure described above, when the front surface-side resin film is formed from an acrylic resin to have a thickness $X_b$ µm, the rear surface-side resin film is formed from a polyimide resin to have a thickness $Y_b$ µm, and the total thickness of the resin substrate, the front surface-side inorganic films, and the rear surface-side inorganic film is represented by $X_c$ µm, since the thickness $Y_b$ of the rear surface-side resin film satisfies the following relational expression, based on the results of the simulations shown in FIGS. 10 and 12, the curvature diameter of the active matrix substrate is set to 20 mm or more or −20 mm or less, and in particular, the workability of the active matrix substrate can be secured.

$$(-0.045X_b^2+1.4939X_b-1.9462)(-0.0348X_c^2+0.1518X_c+1.4817) \leq Y_b \leq (0.0173X_b^2+0.8303X_b+1.4109)(0.0073X_c^2-0.0011X_c+0.7038)$$

The thin film electrical element described above is a thin film transistor including a gate electrode and a semiconductor layer, and the plurality of front surface-side inorganic films described above may include an underlayer film provided on the surface of the resin substrate, a gate insulating film provided between the gate electrode and the semiconductor layer, and a protective film provided so as to cover the thin film transistor.

According to the structure described above, since the plurality of front surface-side inorganic films includes the underlayer film provided between the resin substrate and the thin film transistor, the gate insulating film provided as a part of the thin film transistor, and the protective film provided so as to cover the thin film transistor, in particular, a thin film-transistor type active matrix substrate is formed.

The resin substrate described above may have transparency.

According to the structure described above, since the resin substrate has transparency, in particular, an active matrix substrate used for a transmissive type or a semi-transmissive type liquid crystal display device is formed.

The front surface-side resin film and the rear surface-side resin film may also have transparency.

According to the structure described above, since the front surface-side resin film and the rear surface-side resin film have transparency, in particular, an active matrix substrate used for a transmissive type or a semi-transmissive type liquid crystal display device is formed.

In addition, a display device of the present invention includes the active matrix substrate described above, a counter substrate provided so as to face a front surface side of the active matrix substrate at which the thin film electrical element is provided, and a display medium layer provided between the active matrix substrate and the counter substrate.

According to the structure described above, since there are provided the active matrix substrate, the counter substrate provided so as to face the active matrix substrate, and the display medium layer provided between the above two substrates, the warpage of the active matrix substrate and that of the display device including the same can be suppressed, and hence, the workability of the active matrix substrate and that of the display device including the same can be secured.

The display medium layer described above may be a liquid crystal layer.

According to the structure described above, since the display medium layer is a liquid crystal layer, in particular, as the display device, a liquid crystal display device is formed.

Advantageous Effects of Invention

According to the present invention, at the rear surface side of the transparent resin substrate having a heat resistance, since there is provided the rear surface-side inorganic film having a thickness set in a predetermined range with respect to the total thickness of the plurality of front surface-side inorganic films provided at the front surface side, the warpage of the active matrix substrate using a resin substrate is suppressed, and as a result, the workability of the active matrix substrate can be secured.

DESCRIPTION OF EMBODIMENTS

Hereinafter, embodiments of the present invention will be described in detail with reference to the drawings. However, the present invention is not limited to the following embodiments.

Embodiment 1

Figure 15:
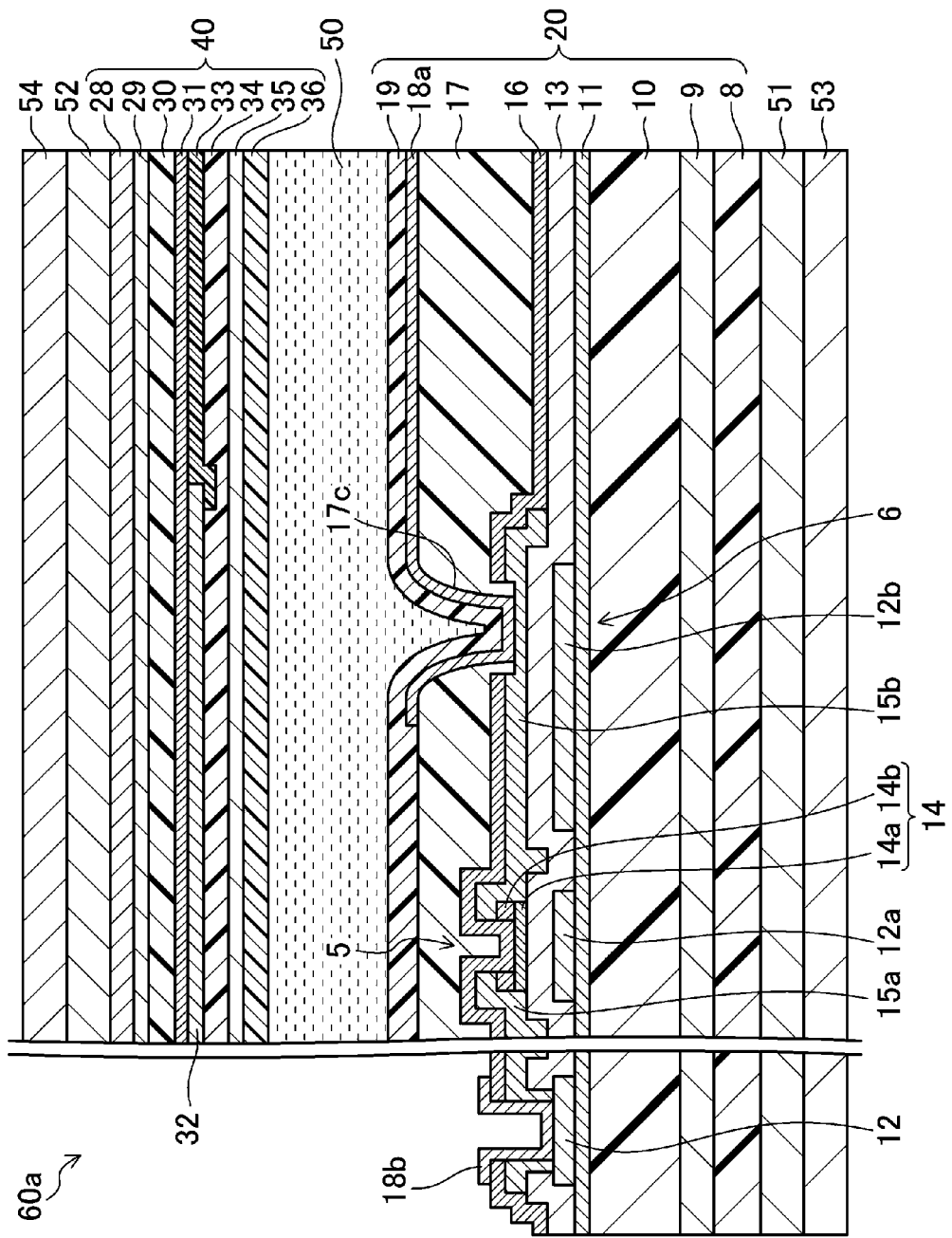
FIG. 15 is a cross-sectional view of a liquid crystal display device according to Embodiment 1.

FIGS. 15 to 24 show Embodiment 1 of an active matrix substrate of the present invention and a display device including the same. In particular, FIG. 15 is a cross-sectional view of a liquid crystal display device 60a of this embodiment. In addition, FIGS. 16 to 24 are first to ninth explanatory cross-sectional views each showing a step of manufacturing the liquid crystal display device 60a.

As shown in FIG. 15, the liquid crystal display device 60a includes an active matrix substrate 20 and a counter substrate 40, which are provided so as to face each other; a liquid crystal layer 50 provided between the active matrix substrate 20 and the counter substrate 40; a sealing material (not shown) provided in the form of a frame so as to adhere the active matrix substrate 20 to the counter substrate 40 and also to seal the liquid crystal layer 50 between the active matrix substrate 20 and the counter substrate 40; a phase compensation film 51 provided on a bottom surface of the active matrix substrate 20 shown in the drawing; a polarization film 53 provided on a bottom surface of the phase compensation film 51 shown in the drawing; a phase compensation film 52 provided on a top surface of the counter substrate 40 shown in the drawing; and a polarization film 54 provided on a top surface of the phase compensation film 52 shown in the drawing.

As shown in FIG. 15, the active matrix substrate 20 includes a transparent rear surface-side resin film 8 having a heat resistance; a rear surface-side inorganic film 9 provided on a top surface of the rear surface-side resin film 8 shown in the drawing; a transparent first resin substrate 10 having a heat resistance and provided on a top surface of the rear surface-side inorganic film 9 shown in the drawing; an underlayer film 11 provided as one front surface-side inorganic film on a top surface of the first resin substrate 10 shown in the drawing; gate lines 12 provided on a top surface of the underlayer film 11 shown in the drawing so as to extend in parallel to each other; capacity lines 12b each provided between the gate lines 12 and arranged so as to extend in parallel to each other; a gate insulating film 13 provided as one front surface-side inorganic film so as to cover the gate lines 12 and the capacity lines 12b; source lines (not shown) provided on a top surface of the gate insulating film 13 shown in the drawing so as to extend in parallel to each other in a direction perpendicular to the gate lines 12; TFTs 5 each provided as a thin film electrical element at each of the intersections between the gate lines 12 and the source lines, that is, at each sub-pixel; a protective film 16 provided as one front surface-side inorganic film so as to cover the TFTs 5 and the source lines; a transparent planarizing film 17 provided as a front surface-side resin film on a top surface of the protective film 16 shown in the drawing; pixel electrodes 18a provided in a matrix on a top surface of the planarizing film 17 and connected to the respective TFTs 5; and an alignment film 19 provided so as to cover the pixel electrodes 18a. In this structure, as the heat resistance required for the first resin substrate 10, for example, a glass transition temperature of 250° C. to 300° C. or more is preferable.

As shown in FIG. 15, the gate line 12 is provided to extend to a terminal region of the active matrix substrate which is exposed from the counter substrate 40 and is connected to a transparent conductive layer 18b in the terminal region.

As shown in FIG. 15, the TFT 5 includes a gate electrode 12a provided on the first resin substrate 10 with the underlayer film 11 interposed therebetween; the gate insulating film 13 provided so as to cover the gate electrode 12a; a semiconductor layer 14 in the form of an island provided on the gate insulating film 13 so as to overlap the gate electrode 12a; and a source electrode 15a and a drain electrode 15b which are provided on the semiconductor layer 14 so as to face each other with a distance therebetween.

The gate electrode 12a is, for example, a portion of the gate line 12 protruding in a side direction in each sub-pixel.

As shown in FIG. 15, the semiconductor layer 14 includes an intrinsic amorphous silicon layer 14a having a channel region and n$^+$ amorphous silicon layers 14b which are provided on the intrinsic amorphous silicon layer 14a to expose the channel region and which are connected to the source electrode 15a and the drain electrode 15b.

The source electrode 15a is, for example, a portion of the source line protruding in a side direction in each sub-pixel.

As shown in FIG. 15, the drain electrode 15b is connected to the pixel electrode 18a via a through-hole 17c formed in the planarizing film 17. In addition, as shown in FIG. 15, the drain electrode 15b overlaps the capacity line 12b in each sub-pixel with the gate insulating film 13 interposed therebetween to form an auxiliary capacity 6.

The rear surface-side inorganic film 9, the underlayer film 11, the gate insulating film 13, and the protective film 16 are each, for example, a silicon nitride film.

In this embodiment, when the total thickness of the underlayer film 11, the gate insulating film 13, and the protective film 16 is represented by $X_a$ (µm), a thickness $Y_a$ (µm) of the rear surface-side inorganic film 9 satisfies the following relational expression.

$$-0.1263X_a^2 + 0.674X_a + 0.0733 \leq Y_a \leq 25.321Xa^3 - 49.8X_a^2 + 34.76X_a - 7.355$$

The planarizing film 17 is formed, for example, of an acrylic resin. In addition, in this embodiment, although the planarizing film 17 formed of an acrylic resin having excellent transparency and heat resistance is described by way of example, the planarizing film 17 may also be formed, for example, of a polyimide resin, an epoxy resin, a phenol resin, or a silicone resin.

The rear surface-side resin film 8 is formed, for example, of a polyimide resin.

In this embodiment, when the thickness of the planarizing film 17 is represented by $X_b$ (μm), and the total thickness of the first resin substrate 10, the underlayer film 11, the gate insulating film 13, the protective film 16, and the rear surface-side inorganic film 9 is represented by $X_c$ (μm), the thickness $Y_b$ (μm) of the rear surface-side resin film 8 satisfies the following relational expression.

$$(-0.045X_b^2+1.4939X_b-1.9462)(-0.0348X_c^2+0.1518X_c+1.4817) \leq Y_b \leq (0.0173X_b^2+0.8303X_b+1.4109)(0.0073X_c^2-0.0011X_c+0.7038)$$

In addition, in this embodiment, although the rear surface-side resin film 8 formed of a polyimide resin having a high heat resistance is described by way of example, the rear surface-side resin film 8 may also be formed, for example, of a poly(amide imide) resin, a polybenzimidazole resin, or a silicone resin.

As shown in FIG. 15, the counter substrate 40 includes a transparent rear surface-side resin film 28 having a heat resistance; a rear surface-side inorganic film 29 provided on a bottom surface of the rear surface-side resin film 28 shown in the drawing; a transparent second resin substrate 30 having a heat resistance provided on a bottom surface of the rear surface-side inorganic film 29 shown in the drawing; an underlayer film 31 provided on a bottom surface of the second resin substrate 30 shown in the drawing; a black matrix 32 in the form of a lattice provided on a bottom surface of the underlayer film 31 shown in the drawing; a color filter 33 including red layers, green layers, blue layers, and the like provided in spaces in the lattice of the black matrix 32; a transparent planarizing film 34 provided as a front surface-side resin film so as to cover the black matrix 32 and the color filter 33; a common electrode 35 provided on a bottom surface of the planarizing film 34 shown in the drawing; and an alignment film 36 provided so as to cover the common electrode 35.

The first resin substrate 10 and the second resin substrate 30 are each formed of a polyimide resin selected from (all) aromatic polyimides, aromatic (carboxylic acid component)-cycloaliphatic (diamine component) polyimides, cycloaliphatic (carboxylic acid component)-aromatic (diamine component) polyimides, (all) cycloaliphatic polyimides, fluorinated aromatic polyimides, and the like. Among the compounds mentioned above, in cycloaliphatic polyimides in which charge-transfer complexes are not formed in and between molecules and fluorinated aromatic polyimides in which charge-transfer complexes are not likely to be formed in and between molecules due to fluorine-containing structures, the transparency in a visible light region is improved. In addition, as the transparency of the first resin substrate 10 and that of the second resin substrate 30, the total luminance transmittance with respect to the visible light region (wavelength region of 400 to 800 nm) is preferably 80% or more.

The liquid crystal layer 50 is formed, for example, of a liquid crystal material, such as a nematic material, having electro-optic characteristics.

The liquid crystal display device 60a having the above structure is configured to display an image in such a way that the orientation state of the liquid crystal layer 50 is changed by applying a predetermined voltage to the liquid crystal layer 50 in each sub-pixel arranged between each pixel electrode 18a on the active matrix substrate 20 and the common electrode 35 on the counter substrate 40, and the transmittance of light of each sub-pixel is adjusted thereby.

Next, a method for manufacturing the liquid crystal display device 60a of this embodiment will be described with reference to FIGS. 16 to 24. The manufacturing method of this embodiment includes a first resin-substrate forming step, an active matrix substrate-precursor forming step, a second resin-substrate forming step, a counter substrate-precursor forming step, a panel precursor forming step, a first resin-substrate separating step, and a second resin-substrate separating step.

<First Resin-Substrate Forming Step>

First, after a silane coupling agent is applied on a first supporting substrate 7 (see FIG. 16), such as a glass substrate, by a spin coating method or the like, a heat treatment is performed to form a silane coupling film (not shown).

Figure 16:
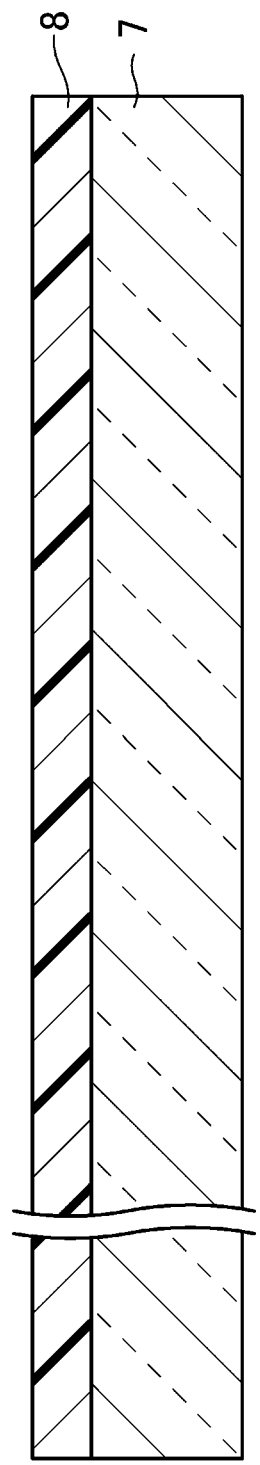
FIG. 16 is a first explanatory cross-sectional view partially showing a step of manufacturing the liquid crystal display device according to Embodiment 1.

Subsequently, after a resin solution of a polyamic acid is applied, for example, by a spin coating method over the substrate on which the silane coupling film is formed, a heat treatment is performed to evaporate an organic solvent from the resin solution and at the same time to perform an imidization reaction, so that as shown in FIG. 16, the rear surface-side resin film 8 is formed to have a thickness of approximately 1.5 to 3.5 μm. In this step, the resin solution is a solution in which a polyamic acid, which is a precursor of a polyimide, is dissolved in an organic solvent, such as dimethylacetamide or N-methylpyrrolidone. In addition, in the heat treatment of the resin solution, for example, the first supporting substrate 7 on which the resin solution is applied is placed on a hot plate, and heating is then performed in the air at approximately 40° C. to 100° C. for approximately 5 minutes to 1 hour. Next, in order to perform imidization while discoloration to yellow caused by oxidation is suppressed, heating is performed in a nitrogen atmosphere (an oxygen concentration of 100 ppm or less) at approximately 250° C. to 350° C. for approximately 1 to 3 hours.

Figure 17:
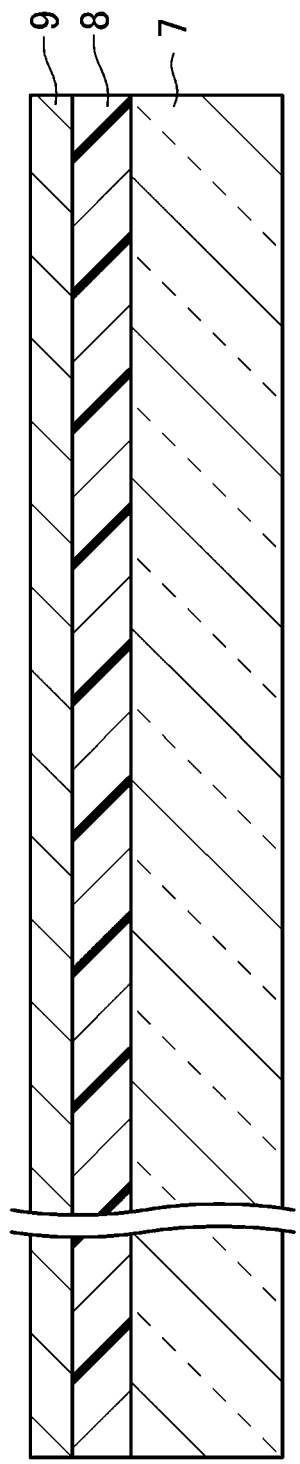
FIG. 17 is a second explanatory cross-sectional view partially showing a step of manufacturing the liquid crystal display device following the step shown in FIG. 16.

Furthermore, a silicon nitride film having a thickness of approximately 0.6 to 2.0 μm is formed at approximately 300° C. or more by a plasma CVD (Chemical Vapor Deposition) method or the like over the substrate on which the rear surface-side resin film 8 is formed, so that as shown in FIG. 17, the rear surface-side inorganic film 9 is formed.

Subsequently, after a silane coupling agent is applied, for example, by a spin coating method over the substrate on which the rear surface-side inorganic film 9 is formed, a heat treatment is performed to form a silane coupling film (not shown).

Figure 18:
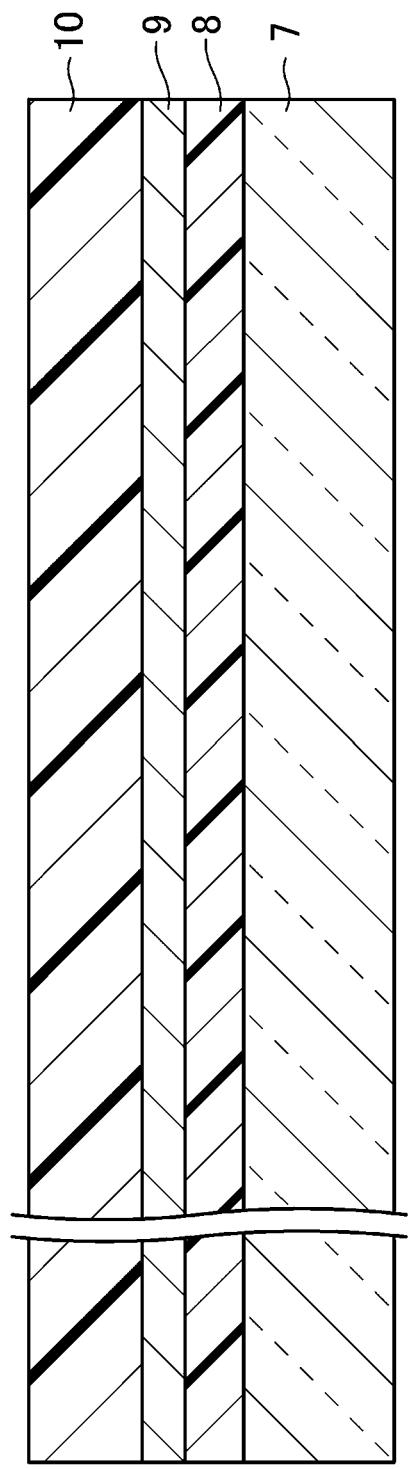
FIG. 18 is a third explanatory cross-sectional view partially showing a step of manufacturing the liquid crystal display device following the step shown in FIG. 17.

Furthermore, after a resin solution of a polyamic acid is applied, for example, by a spin coating method over the substrate on which the silane coupling film is formed, a heat treatment is performed so as to evaporate an organic solvent from the resin solution thus applied and at the same time to perform an imidization reaction, thereby forming the first resin substrate 10 to have a thickness of approximately 5 to 20 μm as shown in FIG. 18. In addition, when the first resin substrate 10 is separated from the first supporting substrate 7 in the first resin-substrate separating step which will be described later, in order to maintain the shape of the first resin substrate 10, to suppress the generation of film defects, and to reproducibly perform the separation, the thickness of the first resin substrate 10 is preferably 5 μm or more, and in addition, in order to evaporate the solvent so as not to form a concavo-convex shape in the surface during the heat treatment, the thickness of the first resin substrate 10 is preferably 20 μm or less.

\<Active Matrix Substrate-Precursor Forming Step\>

Figure 19:
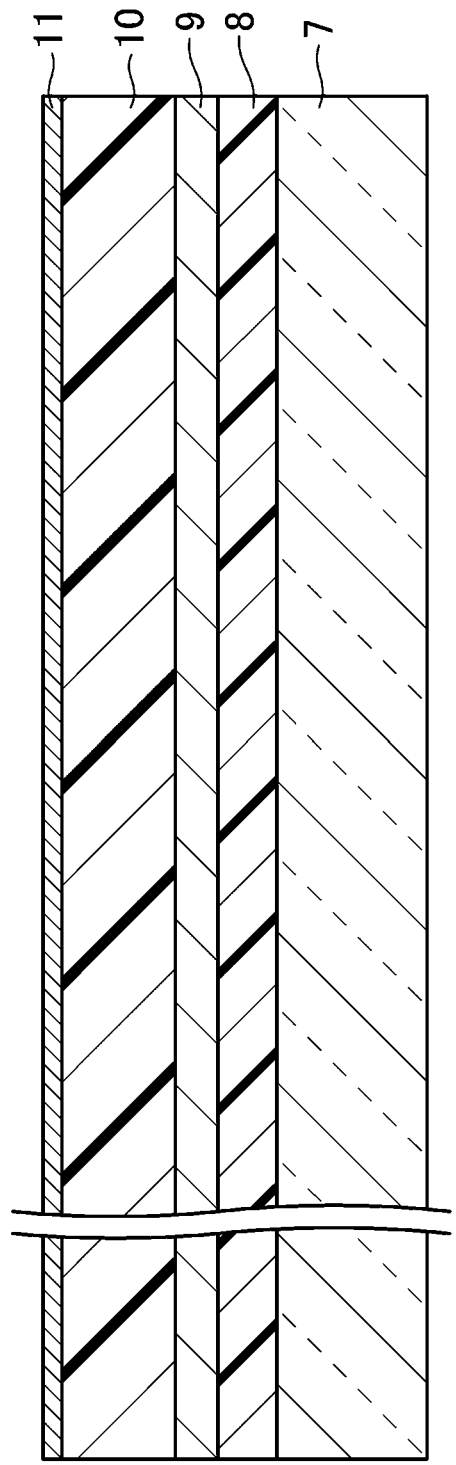
FIG. 19 is a fourth explanatory cross-sectional view partially showing a step of manufacturing the liquid crystal display device following the step shown in FIG. 18.

First, after the surface of the first resin substrate 10 formed in the first resin-substrate forming step is washed with an organic solvent, such as a mixed solution of 2-aminoethanol and dimethylsulfoxide (weight percent ratio: 70:30), dimethylsulfoxide, or N-methylpyrrolidone, a silicon nitride film is formed to have a thickness of approximately 250 nm on the surface of the first resin substrate 10 by a plasma CVD method or the like at a film formation temperature of approximately 250° C. to 300° C., so that as shown in FIG. 19, the underlayer film 11 is formed.

Subsequently, a titanium film (thickness: approximately 30 to 150 nm), an aluminum film (thickness: approximately 200 to 500 nm), and a titanium film (thickness: approximately 30 to 150 nm) are formed, for example, by a sputtering method in this order over the substrate on which the underlayer film 11 is formed, so that a metal laminate film is formed. Next, a photolithographic treatment, an etching treatment, and a resist-peeling treatment are performed on this metal laminate film, thereby forming the gate line 12, the gate electrode 12a, and the capacity line 12b.

Furthermore, over the substrate on which the gate line 12, the gate electrode 12a, and the capacity line 12b are formed, a silicon nitride film is formed, for example, by a plasma CVD method at a film formation temperature of approximately 250° C. to 300° C. to have a thickness of approximately 400 nm, so that the gate insulating film 13 is formed.

Next, after an intrinsic amorphous silicon film (thickness: approximately 70 to 150 nm) and an $n^+$ amorphous silicon film (thickness: approximately 40 to 80 nm) doped with phosphorus are formed, for example, by a plasma CVD method in this order over the substrate on which the gate insulating film 13 is formed, a photolithographic treatment, an etching treatment, and a resist-peeling treatment are performed on a laminate film of the intrinsic amorphous silicon film and the $n^+$ amorphous silicon film, so that a semiconductor-layer forming layer is formed.

Subsequently, over the substrate on which the semiconductor-layer forming layer is formed, for example, an aluminum film (thickness: approximately 100 to 400 nm) and a titanium film (thickness: approximately 30 to 100 nm) are formed in this order by a sputtering method to form a metal laminate film. Next, a photolithographic treatment, an etching treatment, and a resist-peeling treatment are performed on the metal laminate film described above, so that the source line, the source electrode 15a, and the drain electrode 15b are formed.

Furthermore, the $n^+$ amorphous silicon layer of the semiconductor-layer forming layer is etched to form a channel region using the source electrode 15a and the drain electrode 15b as masks, so that the semiconductor layer 14 and the TFT 5 including the same are formed.

In addition, a silicon nitride film is formed, for example, by a plasma CVD method at a film formation temperature of approximately 250° C. to 300° C. to have a thickness of approximately 250 nm over the substrate on which the TFT 5 is formed, and a photolithographic treatment, an etching treatment, and a resist-peeling treatment are performed on the inorganic insulating film thus formed, so that the protective film 16 is formed.

Subsequently, over the substrate on which the protective film 16 is formed, an acrylic-based photosensitive resin is applied, for example, by a spin coating method to have a thickness of approximately 2 to 3 μm, and on the photosensitive resin thus applied, exposure and development are performed, so that the planarizing film 17 is formed.

Furthermore, over the substrate on which the planarizing film 17 is formed, after a transparent conductive film, such as an ITO (Indium Tin Oxide) film or an IZO (Indium Zinc Oxide) film, is formed, for example, by a sputtering method to have a thickness of approximately 100 to 200 nm, a photolithographic treatment, an etching treatment, and a resist-peeling treatment are performed on this transparent conductive film, so that the pixel electrode 18a and the transparent conductive layer 18b are formed.

Finally, over the substrate on which the pixel electrode 18a and the transparent conductive layer 18b are formed, after a polyimide-based resin film is applied, for example, by a screen printing method to have a thickness of approximately 100 nm, a firing treatment and a rubbing treatment are performed on the film thus applied, so that the alignment film 19 is formed.

Figure 20:
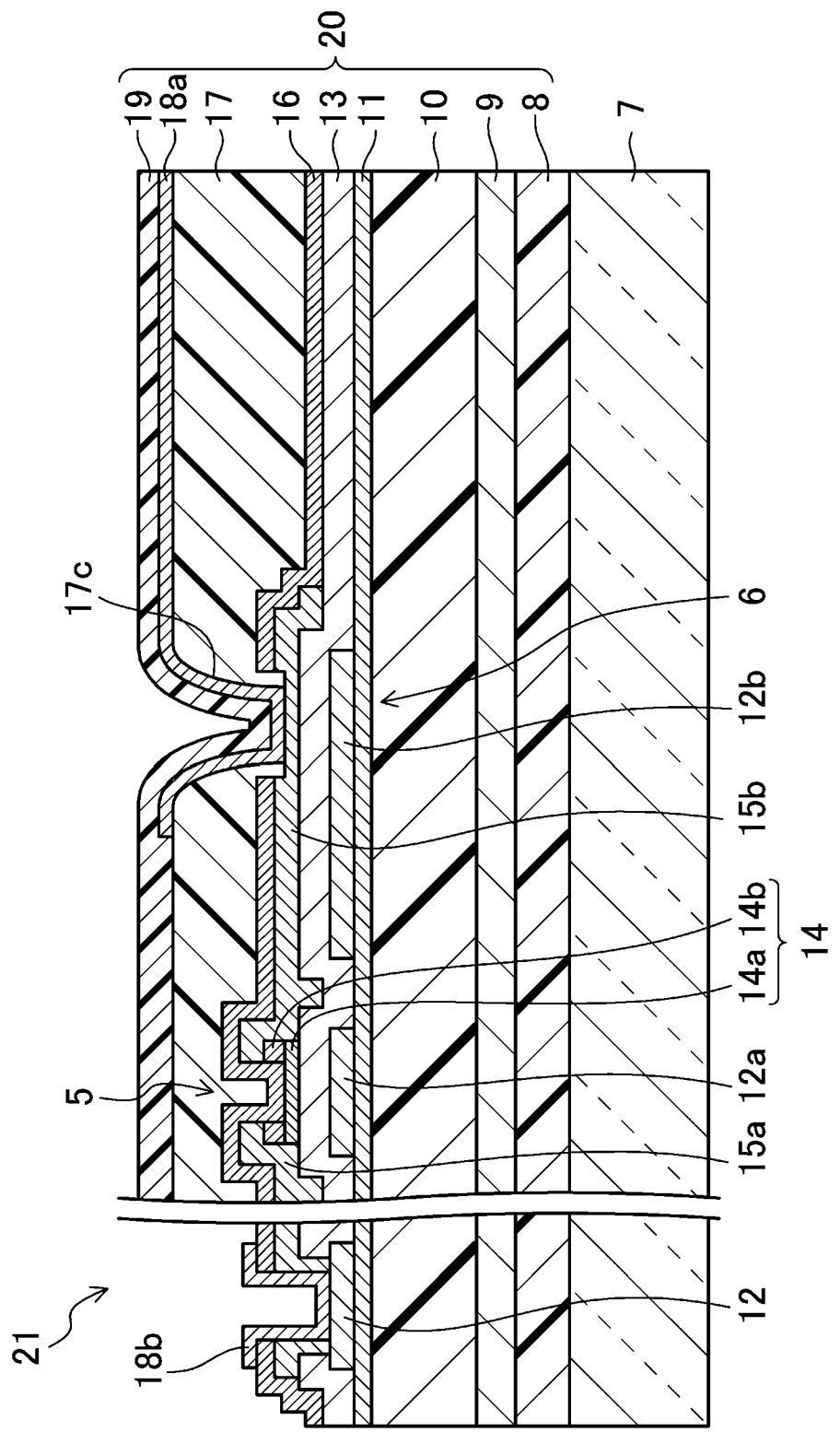
FIG. 20 is a fifth explanatory cross-sectional view partially showing a step of manufacturing the liquid crystal display device following the step shown in FIG. 19.

As described above, an active matrix-substrate precursor 21 as shown in FIG. 20 can be formed.

\<Second Resin-Substrate Forming Step\>

First, after a silane coupling agent is applied on a second supporting substrate 27, such as a glass substrate, by a spin coating method or the like, a heat treatment is performed, so that a silane coupling film (not shown) is formed.

Subsequently, after a resin solution of a polyamic acid is applied by a spin coating method or the like over the substrate on which the silane coupling film is formed, a heat treatment is performed so as to evaporate an organic solvent from the resin solution and at the same time to perform an imidization reaction, thereby forming the rear surface-side resin film 28 to have a thickness of approximately 2.0 to 3.2 μm.

Furthermore, a silicon nitride film is formed, for example, by a plasma CVD method to have a thickness of approximately 0.2 to 0.3 μm over the substrate on which the rear surface-side resin film 28 is formed, so that the rear surface-side inorganic film 29 is formed.

Next, after a silane coupling agent is applied, for example, by a spin coating method over the substrate on which the rear surface-side inorganic film 29 is formed, a heat treatment is performed, so that a silane coupling film (not shown) is formed.

Furthermore, after a resin solution of a polyamic acid is applied, for example, by a spin coating method over the substrate on which the silane coupling film is formed, a heat treatment is performed so as to evaporate an organic solvent in the resin solution thus applied and at the same time to perform an imidization reaction, thereby forming the second resin substrate 30 to have a thickness of approximately 5 to 20 μm.

\<Counter Substrate-Precursor Forming Step\>

First, after the surface of the second resin substrate 30 formed in the second resin-substrate forming step described above is washed with an organic solvent, such as a mixed solution of 2-aminoethanol and dimethylsulfoxide, dimethylsulfoxide, or N-methylpyrrolidone, a silicon nitride film is formed, for example, by a plasma CVD method to have a thickness of approximately 250 nm on the surface of the second resin substrate 30, so that the underlayer film 31 is formed.

Subsequently, after a metal film, such as a chromium film (thickness: approximately 100 nm), is formed, for example, by a sputtering method over the substrate on which the underlayer film 31 is formed, a photolithographic treatment, an etching treatment, and a resist-peeling treatment are performed on the metal film described above, so that the black matrix 32 is formed.

Furthermore, after a photosensitive resin having a red, a green, or a blue color is applied, for example, by a spin coating method over the substrate on which the black matrix 32 is formed, the film thus applied is exposed and developed to form a color layer (such as a red color layer) of a selected color having a thickness of approximately 1 μm, and the same procedure as described above is repeatedly performed for the other two colors so that the other two color layers (such as a green color layer and a blue color layer) are each formed to have a thickness of approximately 1 μm, thereby forming the color filter 33.

Subsequently, over the substrate on which the color filter 33 is formed, after an acrylic resin is applied to have a thickness of approximately 2.5 μm, for example, by a spin coating method, a heat treatment is performed, so that the planarizing film 34 is formed.

Furthermore, a transparent conductive film, such as an ITO film or an IZO film, is formed to have a thickness of approximately 100 nm, for example, by a sputtering method using a mask over the substrate on which the planarizing film 34 is formed, so that the common electrode 35 is formed.

Finally, over the substrate on which the common electrode 35 is formed, after a polyimide-based resin film is applied to have a thickness of approximately 100 nm, for example, by a screen printing method, a firing treatment and a rubbing treatment are performed on the film thus applied, so that the alignment film 36 is formed.

Figure 21:
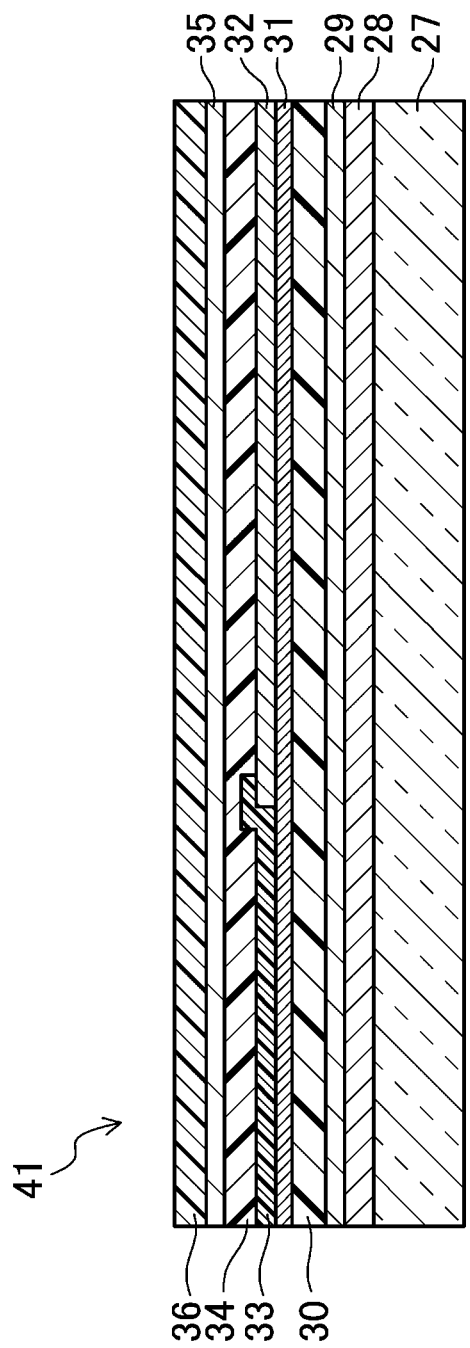
FIG. 21 is a sixth explanatory cross-sectional view partially showing a step of manufacturing the liquid crystal display device following the step shown in FIG. 20.

As described above, a counter-substrate precursor 41 as shown in FIG. 21 is formed.

<Panel Precursor Forming Step>

Figure 22:
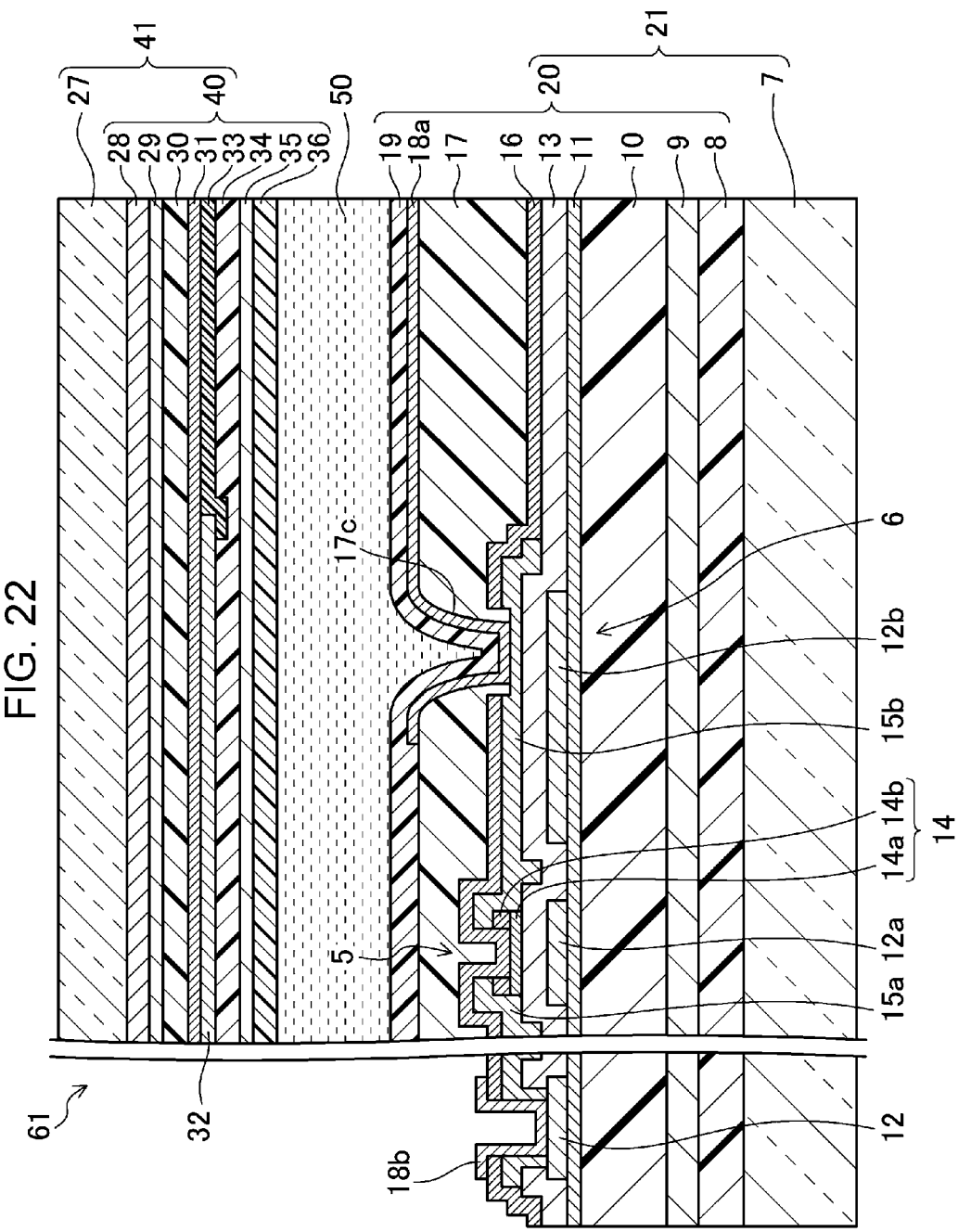
FIG. 22 is a seventh explanatory cross-sectional view partially showing a step of manufacturing the liquid crystal display device following the step shown in FIG. 21.

For example, on the surface of the alignment film 36 on the counter-substrate precursor 41 formed in the above counter-substrate precursor forming step, after a sealing material formed of a thermosetting resin or the like and having a liquid crystal injection port is printed to have a frame shape, the counter-substrate precursor 41 on which the sealing material is printed is adhered to the active matrix-substrate precursor 21 formed in the above active matrix-substrate precursor forming step, and the sealing material is then cured. Subsequently, after a liquid crystal material is injected between the active matrix-substrate precursor 21 and the counter-substrate precursor 41 by a vacuum injection method, the liquid crystal injection port is sealed so that the liquid crystal layer 50 is sealed between the active matrix-substrate precursor 21 and the counter-substrate precursor 41, thereby forming a panel precursor 61 as shown in FIG. 22.

<First Resin-Substrate Separating Step>

Figure 23:
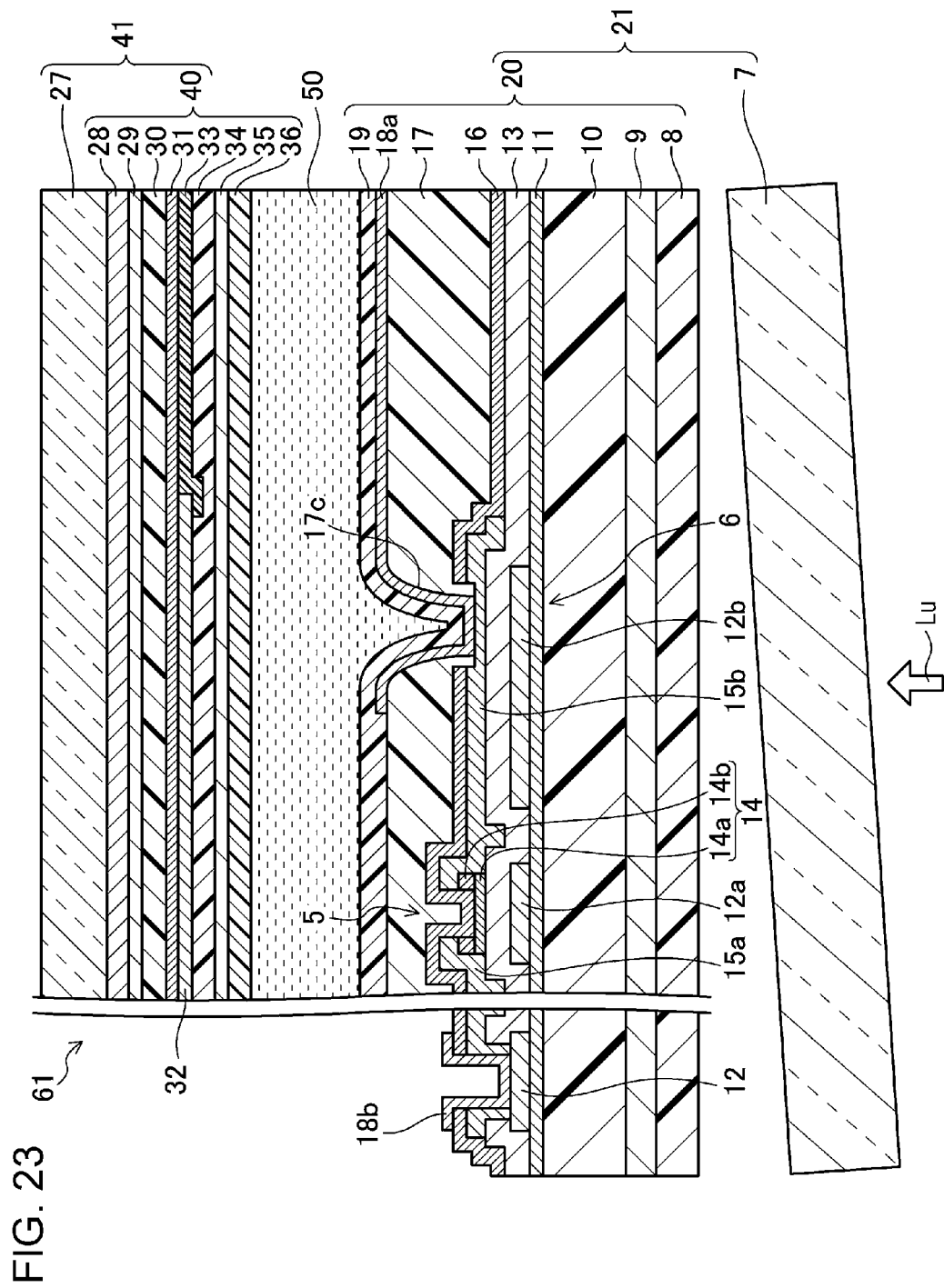
FIG. 23 is an eighth explanatory cross-sectional view partially showing a step of manufacturing the liquid crystal display device following the step shown in FIG. 22.

First, as shown in FIG. 23, UV laser light Lu is irradiated to the panel precursor 61 formed in the above panel precursor forming step from an active matrix-substrate precursor 21 side so that an ablation phenomenon (film decomposition/vaporization caused by heat absorption) which is caused by absorption of UV rays is allowed to occur at a portion of a rear surface-side resin film 8 side of the boundary between the first supporting substrate 7 and the rear surface-side resin film 8, and as a result, the first supporting substrate 7 is separated from the first resin substrate 10 including the rear surface-side resin film 8. In this step, as the irradiated UV laser light Lu, for example, laser light having a wavelength of 308 nm oscillated from a XeCl laser is preferable. In addition, as the ablation conditions, although the conditions are required to be obtained in consideration of the resin substrate to be irradiated, for example, at an irradiation energy of approximately 300 to 500 mW/cm$^2$, irradiation is performed approximately one to 10 shots. In addition, the transmittance of the UV laser light Lu through the rear surface-side resin film 8 and that through a glass substrate (the first supporting substrate 7) are approximately 1% or less and approximately 40% or more, respectively.

Figure 24:
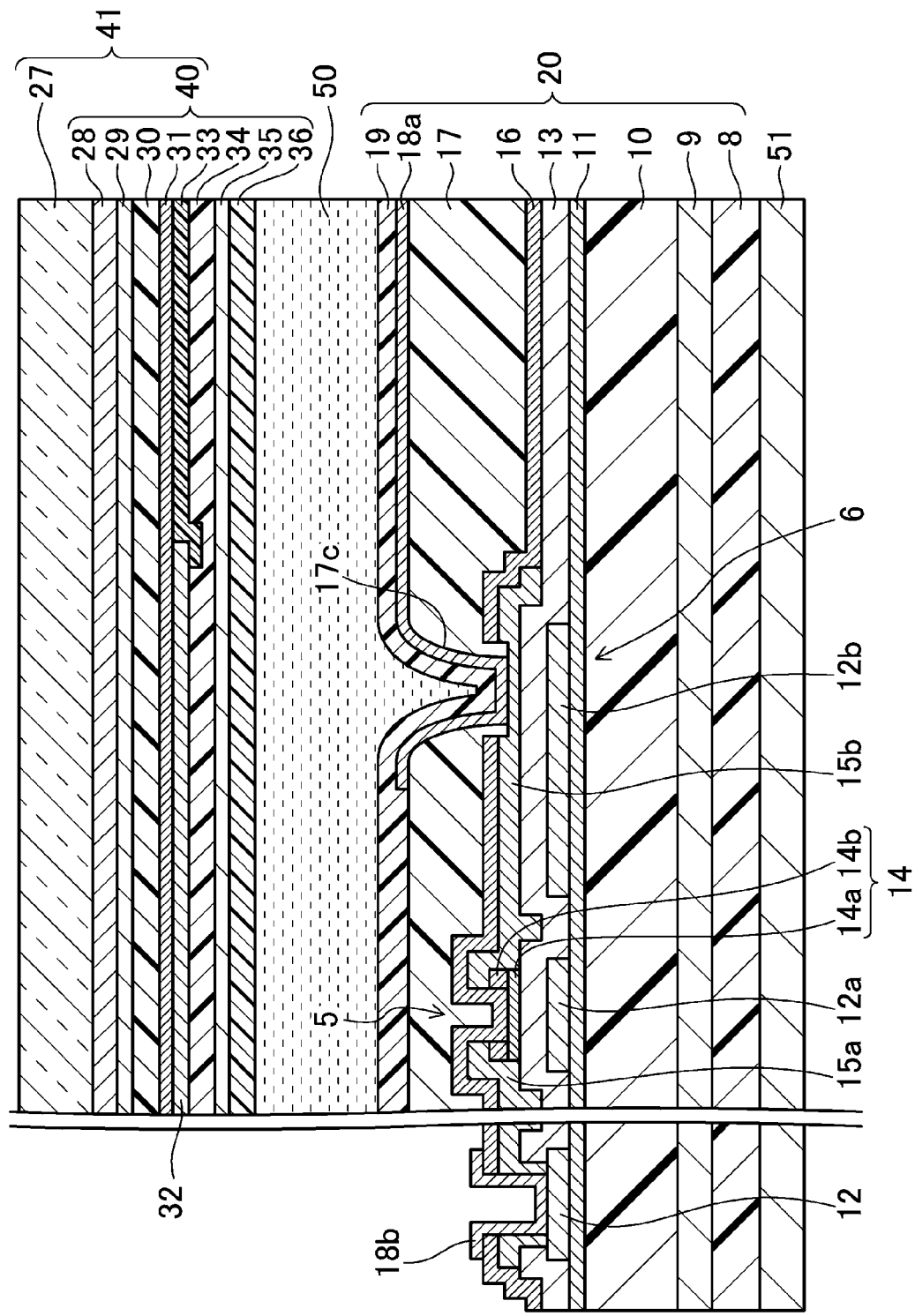
FIG. 24 is a ninth explanatory cross-sectional view partially showing a step of manufacturing the liquid crystal display device following the step shown in FIG. 23.

Subsequently, on the surface of the active matrix substrate 20 which forms the panel precursor 61 and from which the first supporting substrate 7 is separated, as shown in FIG. 24, the phase compensation film 51 is adhered.

<Second Resin-Substrate Separating Step>

First, as is the case of the above first resin-substrate separating step, UV laser light is irradiated from a counter-substrate precursor 41 side to the panel precursor to which the phase compensation film 51 is adhered in the above first resin-substrate separating step, so that the second supporting substrate 27 is separated from the second resin substrate 30 including the rear surface-side resin film 28.

Subsequently, after the phase compensation film 52 is adhered to the surface of the counter substrate 40 forming the panel precursor from which the second supporting substrate 27 is separated, the polarization films 53 and 54 are adhered to the phase compensation films 51 and 52, respectively.

As described above, the liquid crystal display device 60a of this embodiment can be manufactured.

As described above, according to the active matrix substrate 20 of this embodiment, since the rear surface-side inorganic film 9 is provided at the rear surface side of the transparent first resin substrate 10 having a heat resistance, the warpage of the active matrix substrate 20 caused by the underlayer film 11, the gate insulating film 13, and the protective film 16, each of which is provided at the front surface side, can be compensated for. In this case, as described above, the curvature diameter of the active matrix substrate 20 can be calculated based on the linear elastic modulus, the coefficient of linear expansion, and the thickness of the first resin substrate 10; the linear elastic moduli, the coefficients of linear expansion, and the total thickness of the plurality of front surface-side inorganic films (the underlayer film 11, the gate insulating film 13, and the protective film 16); and the linear elastic modulus, the coefficient of linear expansion, and the thickness of the rear surface-side inorganic film 9 using Equations 2, 7, 11, and 13. In addition, when the first resin substrate 10 is formed of a polyimide resin, the plurality of front surface-side inorganic films (the underlayer film 11, the gate insulating film 13, and the protective film 16) are each formed of a silicon nitride film, and the total thickness of the plurality of front surface-side inorganic films is represented by $X_a$ μm, the thickness $Y_a$ μm of the rear surface-side inorganic film satisfies the following relational expression.

$$-0.1263X_a^2+0.674X_a+0.0733 \le Y_a \le 25.321X_a^3 - 49.8X_a^2+34.76X_a-7.355$$

Figure 1:
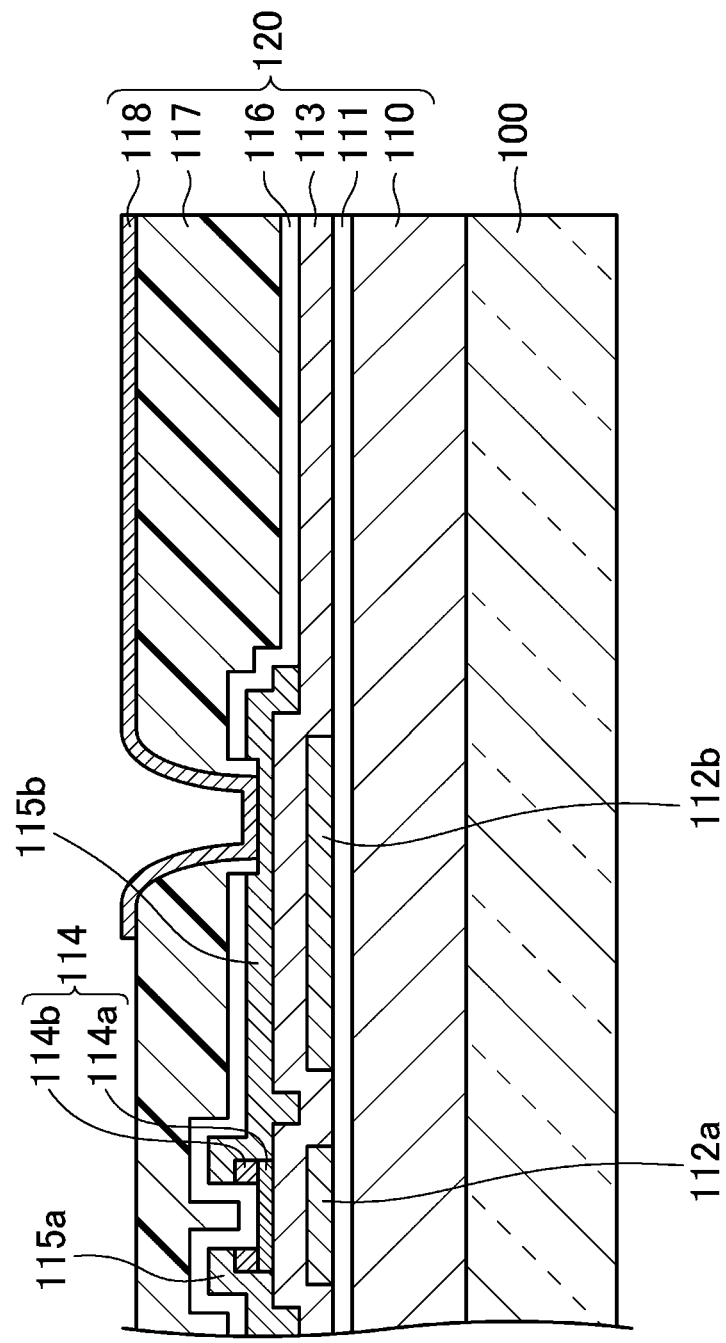
FIG. 1 is a cross-sectional view of an active matrix substrate using a resin substrate formed on a glass substrate.
Figure 2:
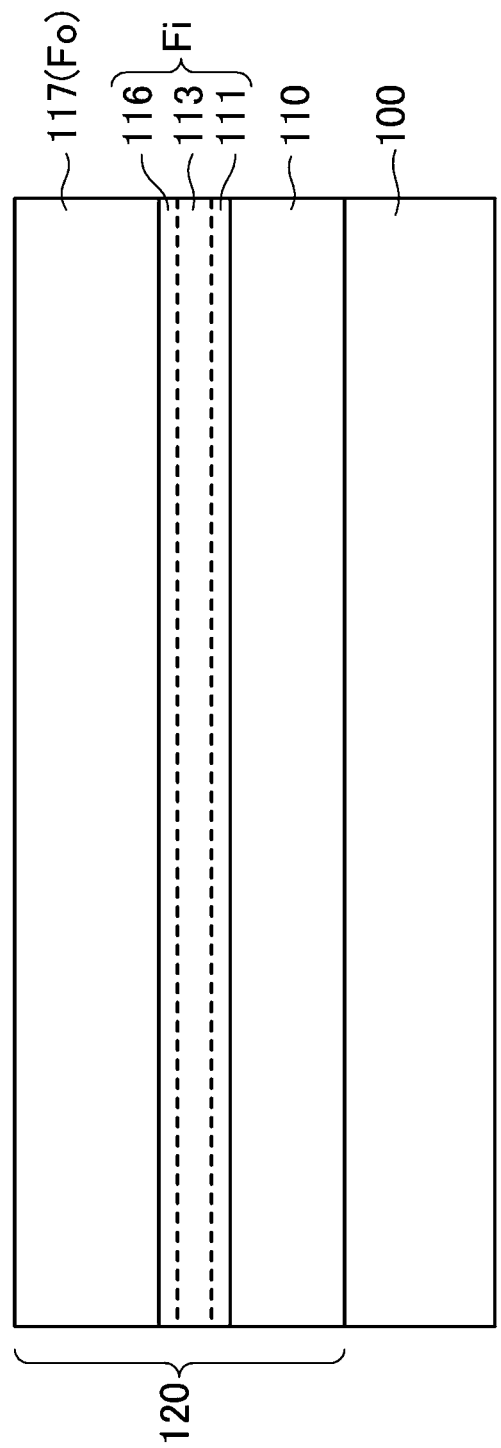
FIG. 2 is a simplified cross-sectional view of the active matrix substrate shown in FIG. 1.
Figure 3:
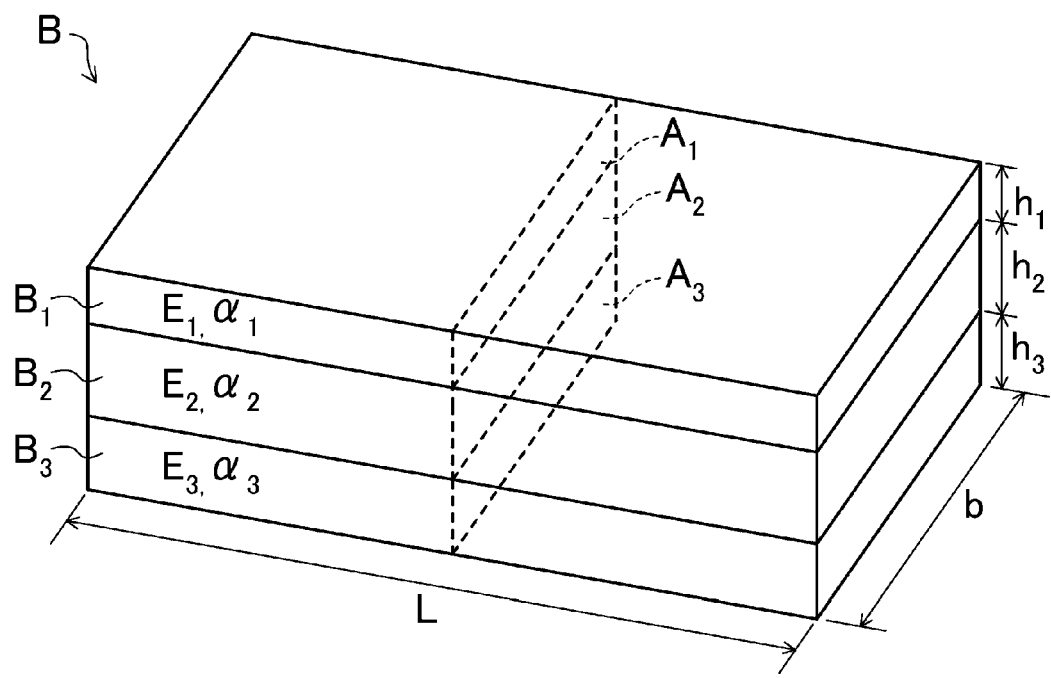
FIG. 3 is a perspective view of a model substrate to obtain a curvature deformation of the active matrix substrate.
Figure 4:
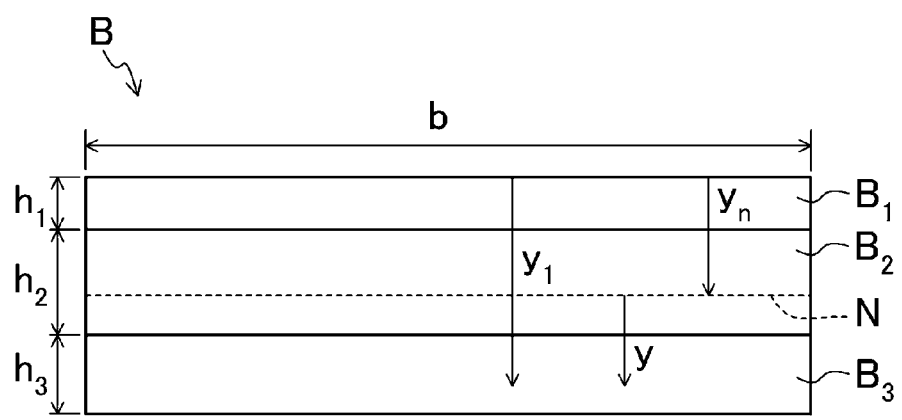
FIG. 4 is a side view of the model substrate.
Figure 5:
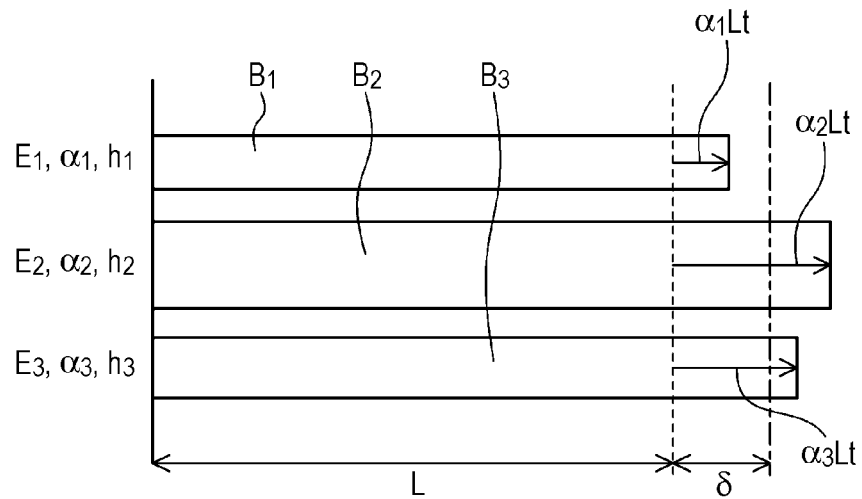
FIG. 5 is an explanatory view showing the expansions of a first substrate, a second substrate, and a third substrate obtained when the first substrate, the second substrate, and the third substrate, which form the model substrate, are not adhered to each other.
Figure 6:
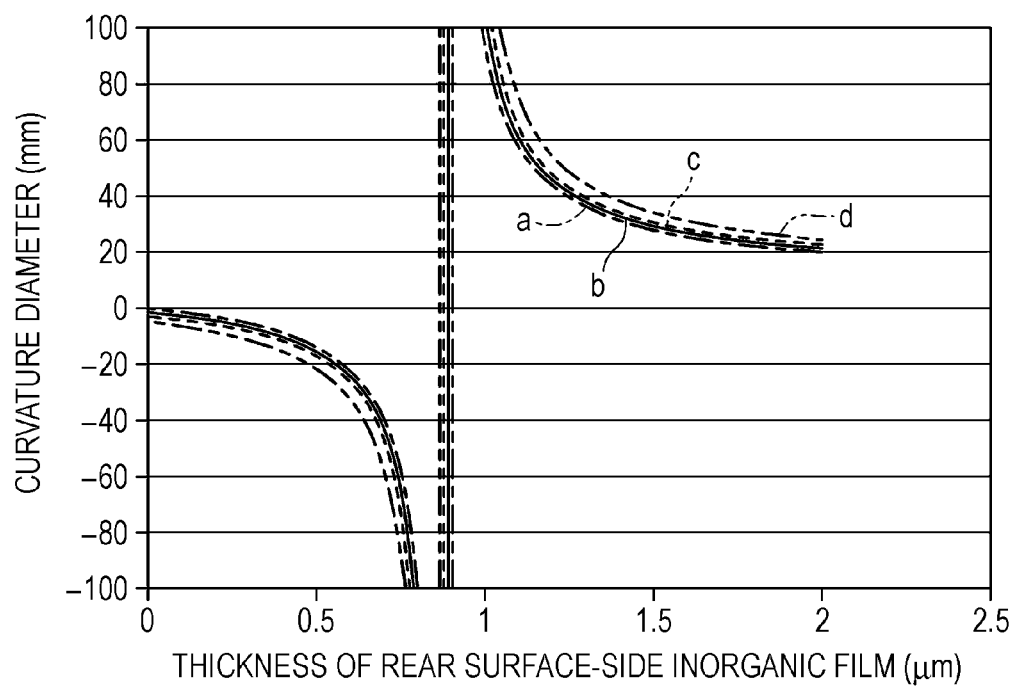
FIG. 6 is a graph showing the relationship between the curvature diameter of the active matrix substrate and the thickness of a rear surface-side inorganic film which is obtained when the thickness of the resin substrate is changed.
Figure 7:
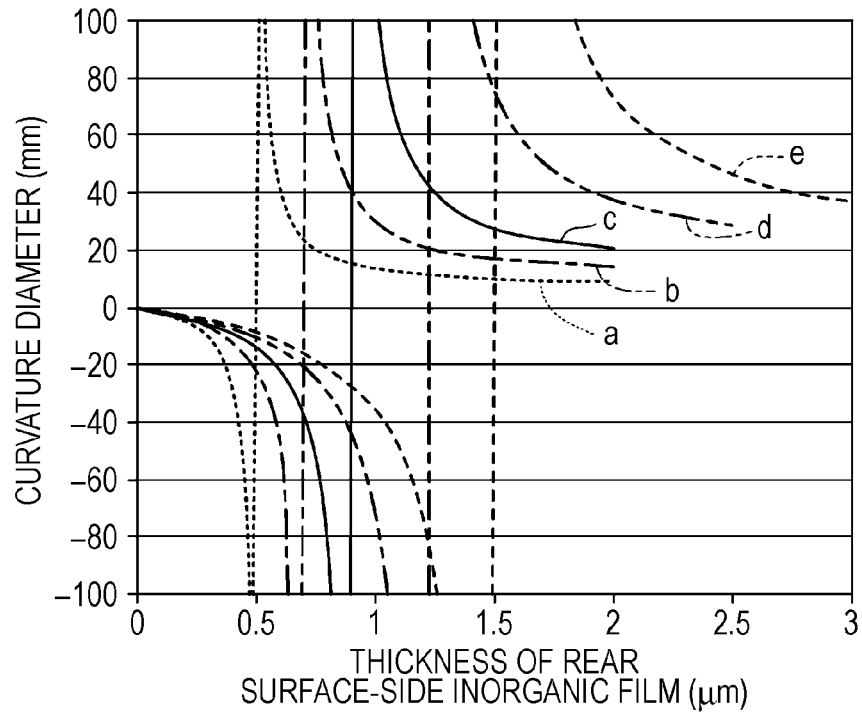
FIG. 7 is a graph showing the relationship between the curvature diameter of the active matrix substrate and the thickness of the rear surface-side inorganic film which is obtained when the thickness of front surface-side inorganic films is changed.
Figure 8:
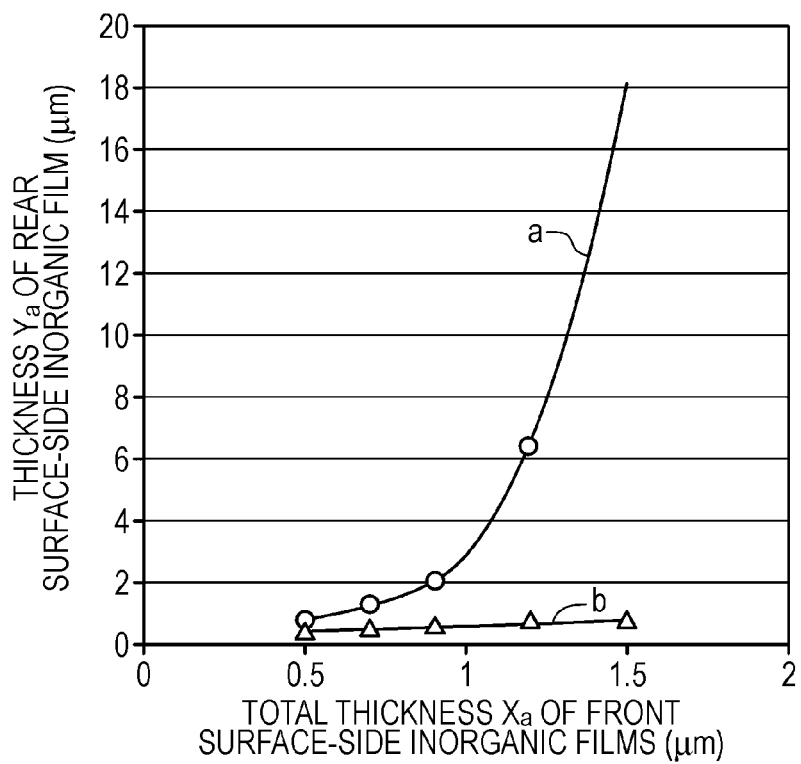
FIG. 8 is a graph showing the relationship between the thickness of the rear surface-side inorganic film and the thickness of the front surface-side inorganic films at which the curvature diameter of the active matrix substrate is 20 mm.
Figure 9:
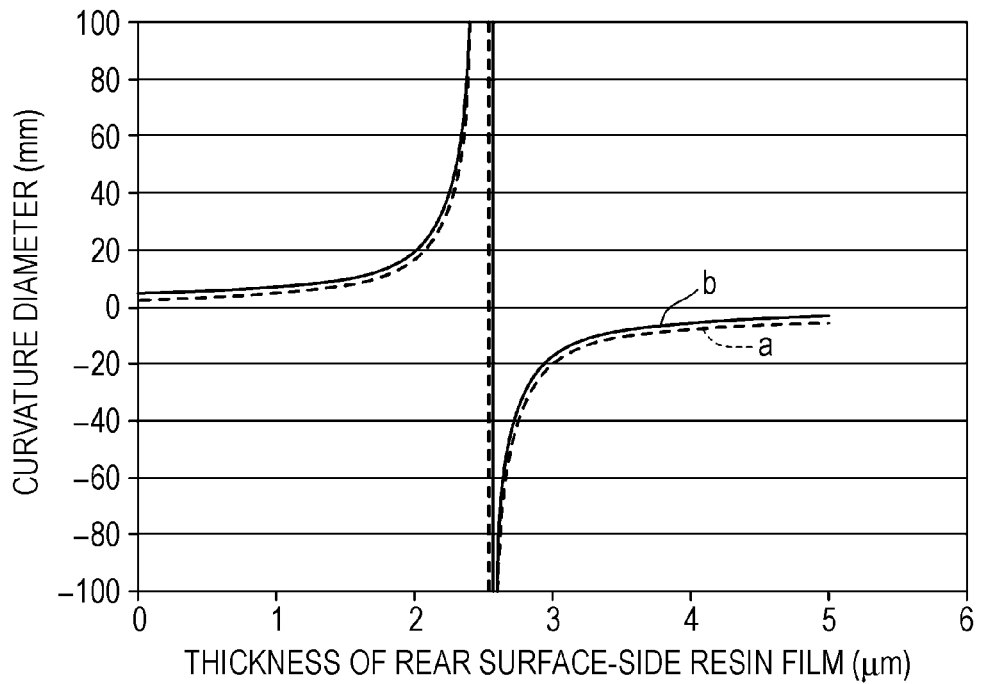
FIG. 9 is a graph showing the relationship between the curvature diameter of the active matrix substrate and the thickness of a rear surface-side resin film which is obtained when the resin substrate is replaced by a silicon nitride film.

Accordingly, based on the results of the simulations shown in FIGS. 6 and 7, the curvature diameter of the active matrix substrate 20 is set to 20 mm or more or −20 mm or less, and hence, the workability of the active matrix substrate 20 can be secured. As a result, the warpage of the active matrix substrate 20 using a resin substrate can be suppressed, and the workability of the active matrix substrate 20 can be secured.

In addition, according to the active matrix substrate 20 of this embodiment, since the planarizing film 17 is provided at the front surface side of the first resin substrate 10, in the liquid crystal display device 60a including the active matrix substrate 20, the orientation of the liquid crystal layer 50 can be suppressed from being disturbed.

In addition, according to the active matrix substrate 20 of this embodiment, since the rear surface-side resin film 8 is provided at the rear surface side of the transparent first resin substrate 10 having a heat resistance, the warpage of the active matrix substrate 20 caused by the planarizing film 17 provided at the front surface side can be compensated for. In this case, as described above, the curvature diameter of the active matrix substrate 20 can be calculated based on the linear elastic modulus, the coefficient of linear expansion, and the thickness of the first resin substrate 10; the linear elastic moduli, the coefficients of linear expansion, and the total thickness of the plurality of front surface-side inorganic films (the underlayer film 11, the gate insulating film 13, and the protective film 16); the linear elastic modulus, the coefficient of linear expansion, and the thickness of the rear surface-side inorganic film 9; the linear elastic modulus, the coefficient of linear expansion, and the thickness of the planarizing film 17; and the linear elastic modulus, the coefficient of linear expansion, and the thickness of the rear surface-side resin film 8 using Equations 2, 7, 11, and 13. In addition, when the planarizing film 17 is formed from an acrylic resin to have a thickness represented by $X_b$ μm, the rear surface-side resin film 8 is formed from a polyimide resin to have a thickness represented by $Y_b$ μm, and the total thickness of the first resin substrate 10, the plurality of surface-side inorganic films, and the rear surface-side inorganic film 9 is represented by $X_c$ μm, the thickness $Y_b$ of the rear surface-side resin film 8 satisfies the following relational expression.

$$(-0.045X_b^2+1.4939X_b-1.9462)(-0.0348X_c^2+ 0.1518X_c+1.4817) \leq Y_b \leq (0.0173X_b^2+0.8303X_b+ 1.4109)(0.0073X_c^2-0.0011X_c+0.7038)$$

Figure 10:
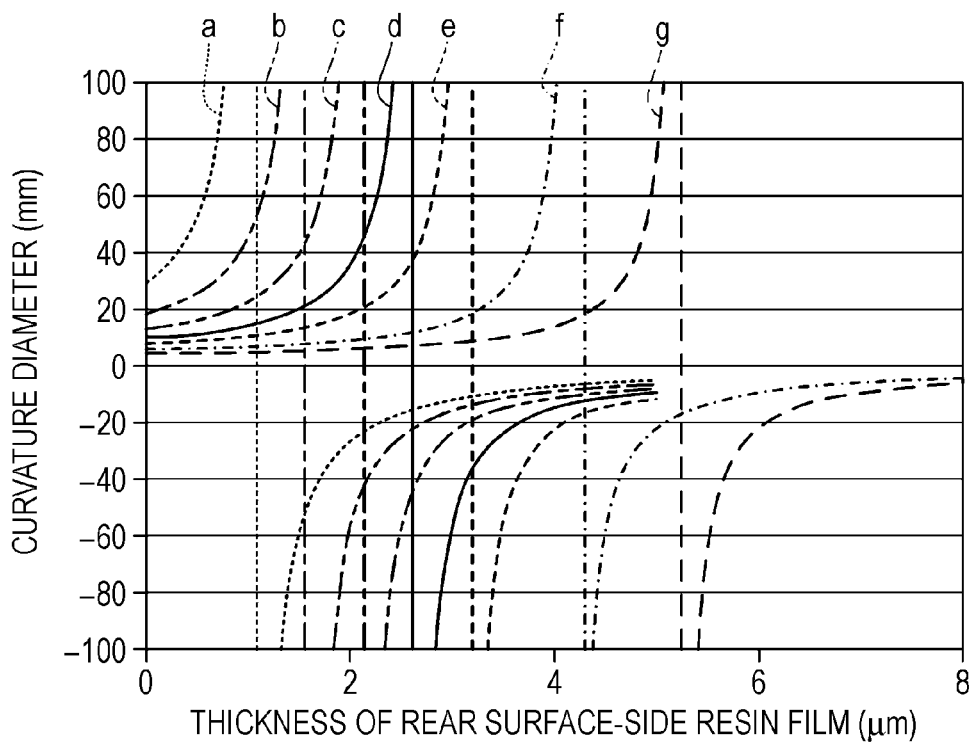
FIG. 10 is a graph showing the relationship between the curvature diameter of the active matrix substrate and the thickness of the rear surface-side resin film which is obtained when the thickness of a front surface-side resin film is changed.
Figure 11:
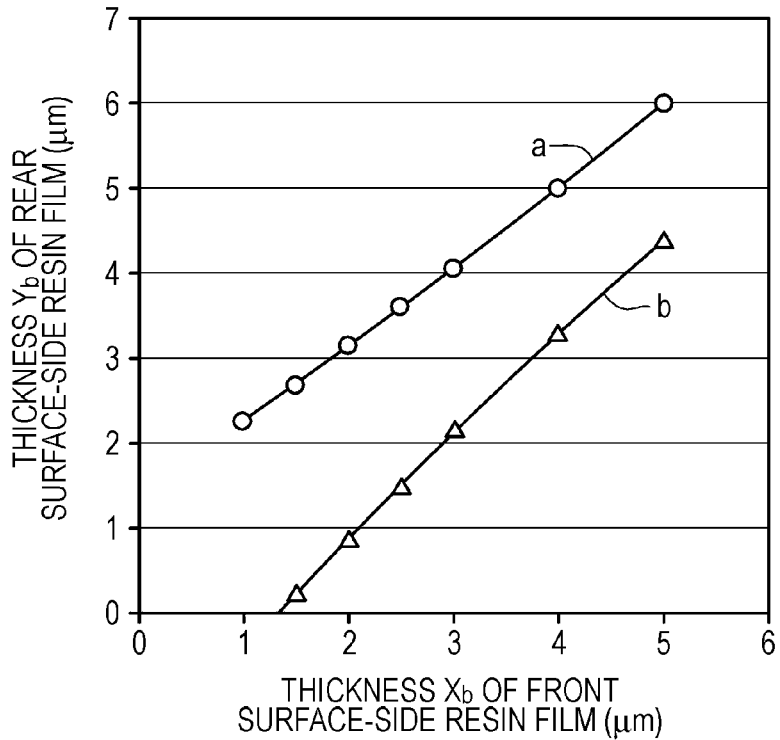
FIG. 11 is a graph showing the relationship between the thickness of the rear surface-side resin film and the thickness of the front surface-side resin film at which the curvature diameter of the active matrix substrate is 20 mm.
Figure 12:
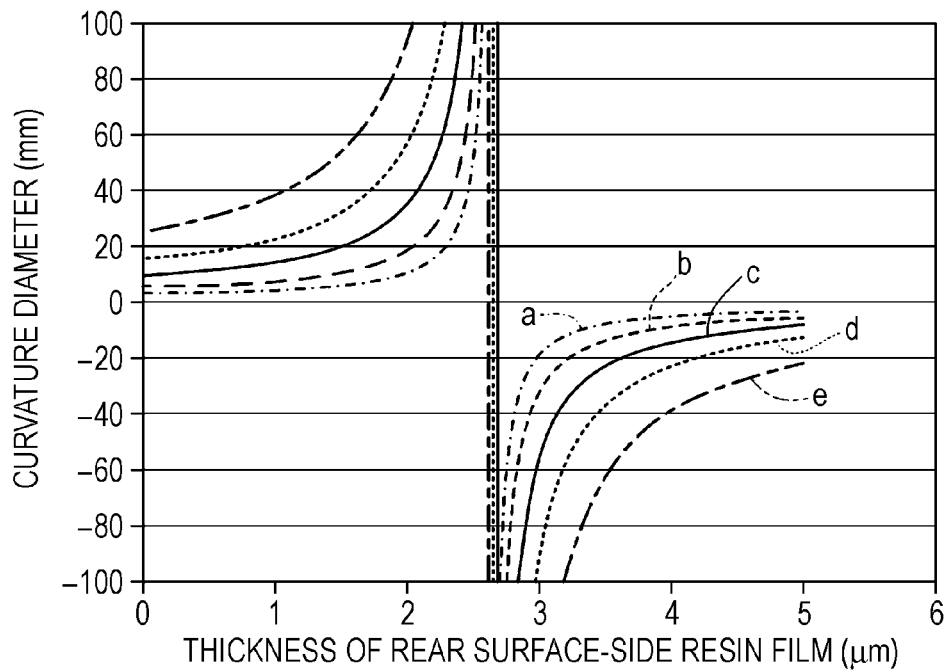
FIG. 12 is a graph showing the relationship between the curvature diameter of the active matrix substrate and the thickness of the rear surface-side resin film which is obtained when the thickness of the resin substrate is changed.
Figure 13:
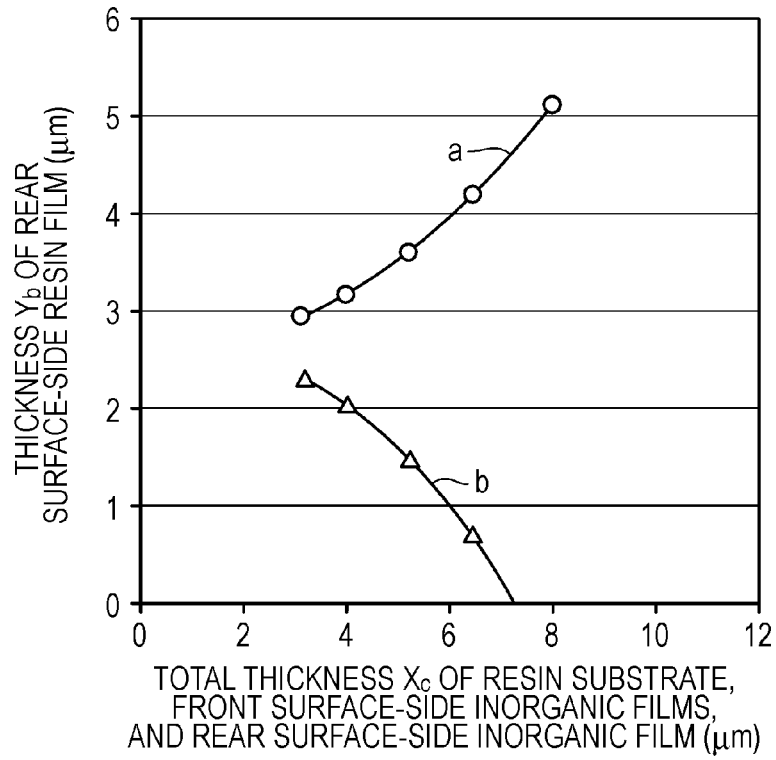
FIG. 13 is a graph showing the relationship between the thickness of the rear surface-side resin film and the total thickness of the resin substrate, the front surface-side inorganic films, and the rear surface-side inorganic film at which the curvature diameter of the active matrix substrate is 20 mm.
Figure 14:
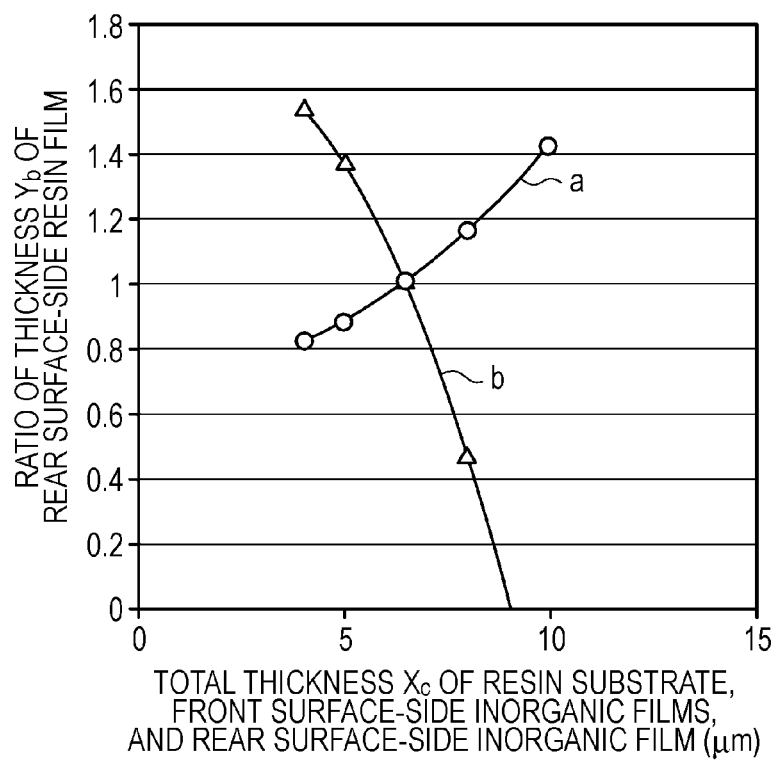
FIG. 14 is a graph obtained by transformation of the graph shown in FIG. 13 so that when the total thickness of the resin substrate, the front surface-side inorganic films, and the rear surface-side inorganic film is 6.5 v, the thickness of the rear surface-side resin film is set to 1.

Accordingly, based on the results of the simulations shown in FIGS. 10 and 12, the curvature diameter of the active matrix substrate 20 is set to 20 mm or more or −20 mm or less, and hence, the workability of the active matrix substrate 20 can be secured. As a result, the warpage of the active matrix substrate 20 using a resin substrate can be suppressed, and the workability of the active matrix substrate 20 can be secured.

In addition, according to the active matrix substrate 20 of this embodiment and the liquid crystal display device 60a including the same, since the warpage of the active matrix substrate 20 is suppressed, preferable electrical connections can be formed between terminals and electronic components mounted in a mounting step of mounting the electronic components in a terminal region of the active matrix substrate of the liquid crystal display device 60a.

In addition, according to the active matrix substrate 20 of this embodiment and the liquid crystal display device 60a including the same, since the warpage of the active matrix substrate 20 is suppressed, mechanical stress applied to elements and wires formed in the active matrix substrate 20 can be reduced, and hence, the manufacturing yield and the reliability of the active matrix substrate 20 and the liquid crystal display device 60a can be improved.

In addition, according to the liquid crystal display device 60a including the active matrix substrate 20 of this embodiment, since the warpage of the active matrix substrate 20 is suppressed, the flatness of the liquid crystal display device 60a can be improved, and hence, the display quality thereof can be improved.

In addition, according to the liquid crystal display device 60a including the active matrix substrate 20 of this embodiment, since the warpage of the active matrix substrate 20 is suppressed, the workability of the liquid crystal display device 60a can be improved in a laminating step to be performed to secure the rigidity and the reliability of the device, and the manufacturing yield and the reliability of the active matrix substrate 20 and the liquid crystal display device 60a can be improved.

In addition, according to the liquid crystal display device 60a including the active matrix substrate 20 of this embodiment, since the warpage of the active matrix substrate 20 is suppressed, connection defects can be suppressed at electrical connection portions between the active matrix substrate 20 and the counter substrate 40 with a common transfer member interposed therebetween, and the manufacturing yield, the reliability, and the quality of the active matrix substrate 20 and the liquid crystal display device 60a can be improved.

In addition, according to the active matrix substrate 20 of this embodiment and the liquid crystal display device 60a including the same, since the warpage of the active matrix substrate 20 is suppressed, handling of the substrate in a manufacturing process can be made easier, and hence, the productivity can be improved.

In addition, according to the active matrix substrate 20 of this embodiment and the liquid crystal display device 60a including the same, since the manufacturing yield and the productivity of the active matrix substrate 20 and the liquid crystal display device 60a can be improved, the manufacturing cost can be reduced.

In addition, according to the active matrix substrate 20 of this embodiment and the liquid crystal display device 60a including the same, since a substrate configuration and/or a correction device for directly correcting the curling of the substrate is not required, the reduction in members to be used and the reduction in manufacturing cost can be realized, and in addition, the reduction in weight and thickness of the liquid crystal display device 60a can also be realized.

In addition, according to the active matrix substrate 20 of this embodiment, since existing TFT manufacturing apparatuses and manufacturing processes can be used, new facility investment can be reduced, and hence, the display device can be manufactured at a low cost.

In addition, according to the active matrix substrate 20 of this embodiment, since the rear surface-side resin film 8 and the rear surface-side inorganic film 9 each function as a barrier film to suppress the permeation of moisture and the like, the reliability of the TFT 5 can be improved.

In addition, according to the active matrix substrate 20 of this embodiment, since the inorganic insulating film is formed at a relatively high temperature (approximately 250° C. to 300° C.), a highly reliable and high-quality thin film electrical element can be formed.

Embodiment 2 of Present Invention

Figure 25:
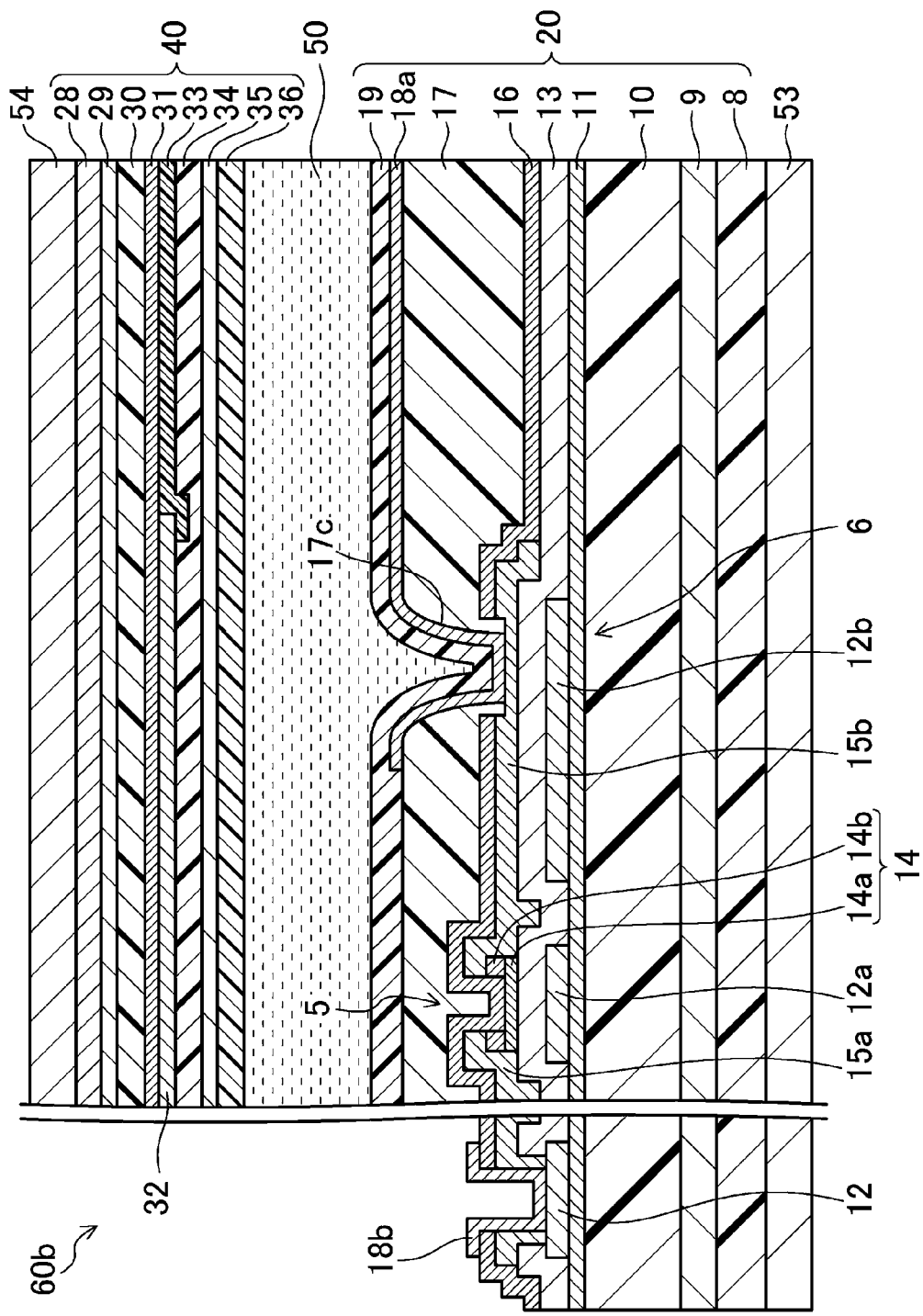
FIG. 25 is a cross-sectional view of a liquid crystal display device according to Embodiment 2.

FIG. 25 is a cross-sectional view of a liquid crystal display device 60b of this embodiment. In addition, in the following embodiments, the same members as those shown in FIGS. 15 to 24 are denoted by the same reference numerals as those used above, and detailed descriptions thereof will be omitted.

In the above Embodiment 1, although the liquid crystal display device 60a including the phase compensation films 51 and 52 has been described by way of example, in this embodiment, the liquid crystal display device 60b including no phase compensation film will be described by way of example.

As shown in FIG. 25, the liquid crystal display device 60b includes an active matrix substrate 20 and a counter substrate 40, which are provided to face each other; a liquid crystal layer 50 provided between the active matrix substrate 20 and the counter substrate 40; a sealing material (not shown) provided in the form of a frame so as to adhere the active matrix substrate 20 to the counter substrate 40 and also to seal the liquid crystal layer 50 between the active matrix substrate 20 and the counter substrate 40; a polarization film 53 provided on a bottom surface of the active matrix substrate 20 shown in the drawing; and a polarization film 54 provided on a top surface of the counter substrate 40 shown in the drawing.

As described above, according to the active matrix substrate 20 and the liquid crystal display device 60b of this embodiment, as is the above Embodiment 1, at a rear surface side of a transparent first resin substrate 10 having a heat resistance, since a rear surface-side inorganic film 9 having a thickness set in a predetermined range with respect to the total thickness of an underlayer film 11, a gate insulating film 13, and a protective film 16, each of which is provided at a front surface side, is provided, and a rear surface-side resin film 8 having a thickness set in a predetermined range with respect to the thickness of a planarizing film 17 at the front surface side is provided, the warpage of the active matrix substrate 20 using a resin substrate is suppressed, and hence, the workability of the active matrix substrate 20 can be secured.

In addition, according to the liquid crystal display device 60b of this embodiment, besides the respective effects described in the above Embodiment 1, since the phase compensation films are not provided, without degrading the balance of the laminate structure of the liquid crystal display device 60b, the thickness thereof can be reduced, and in addition, since the number of members to be used is reduced, the manufacturing unit cost can be reduced, and the number of manufacturing steps can also be reduced.

Embodiment 3 of Present Invention

Figure 26:
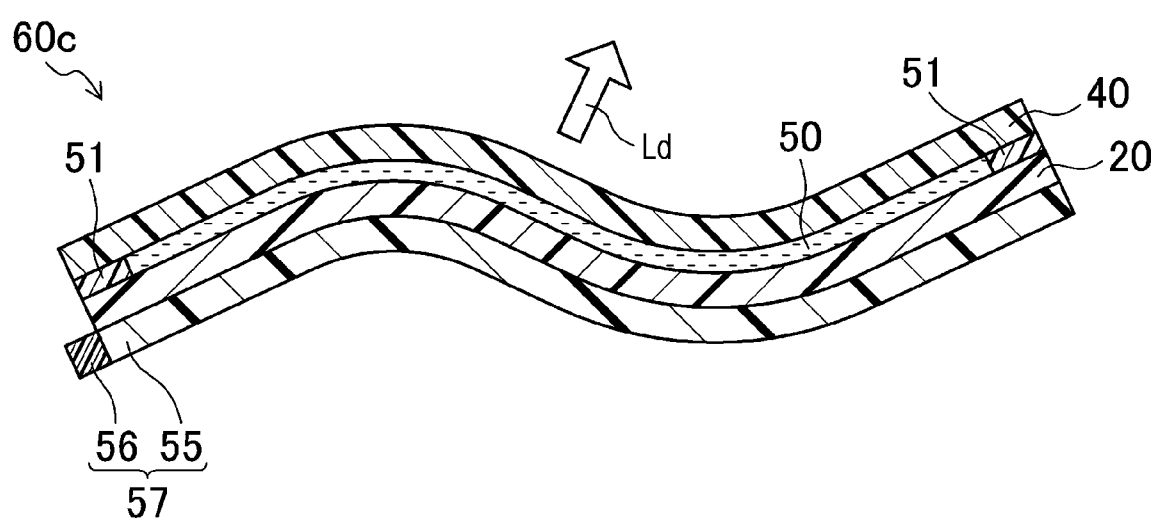
FIG. 26 is a cross-sectional view of a liquid crystal display device according to Embodiment 3.

FIG. 26 is a cross-sectional view of a liquid crystal display device 60c of this embodiment.

Although the liquid crystal display devices 60a and 60b each having a flat shape have been described in the above embodiments by way of example, in this embodiment, the liquid crystal display device 60c having a flexible curved shape will be described by way of example.

In particular, as shown in FIG. 26, the liquid crystal display device 60c includes an active matrix substrate 20 and a counter substrate 40, which are provided to face each other; a liquid crystal layer 50 provided between the active matrix substrate 20 and the counter substrate 40; a sealing material 51 provided in the form of a frame so as to adhere the active matrix substrate 20 to the counter substrate 40 and also to seal the liquid crystal layer 50 between the active matrix substrate 20 and the counter substrate 40; and a backlight 57 provided at a bottom side of the active matrix substrate 20 shown in the drawing. In addition, in FIG. 26, optical sheets (polarization films, phase compensation films, and the like) adhered onto the respective surfaces of the active matrix substrate 20 and the counter substrate 40 are omitted.

As shown in FIG. 26, the backlight 57 includes a flexible light guide plate 55 which changes its shape in accordance with the shape of the active matrix substrate 20 and that of the counter substrate 40, a plurality of light sources 56 provided along one side (left end in the drawing) of the light guide plate 55, and a reflection sheet (not shown) which is provided on a bottom surface of the light guide plate 55 shown in the drawing and which reflects light from each light source 56 to an active matrix substrate 20 side. In this case, the light guide plate 55 is formed, for example, of a transparent silicone rubber. In addition, the light source 56 is formed, for example, of a light emitting diode (LED). In this embodiment, between the active matrix substrate 20 and the light guide plate 55, optical sheets, such as a diffusion sheet and a lens sheet, may also be provided.

The liquid crystal display device 60c having the structure described above is configured to display an image in such a way that the orientation state of the liquid crystal layer 50 is changed by applying a predetermined voltage to the liquid crystal layer 50 in each sub-pixel arranged between each pixel electrode 18a on the active matrix substrate 20 and a common electrode 35 on the counter substrate 40 to adjust the transmittance of light of each sub-pixel, and as shown in FIG. 26, display light Ld is then emitted.

As described above, according to the active matrix substrate 20 of this embodiment and the liquid crystal display device 60c including the same, as is the above Embodiments 1 and 2, since at a rear surface side of a transparent first resin substrate 10 having a heat resistance, a rear surface-side inorganic film 9 having a thickness set in a predetermined range with respect to the total thickness of an underlayer film 11, a gate insulating film 13, and a protective film 16, each of which is provided at a front surface side, is provided, and a rear surface-side resin film 8 having a thickness set in a predetermined range with respect to the thickness of a planarizing film 17 at a front surface side is provided, the warpage of the active matrix substrate 20 using a resin substrate can be suppressed, and hence, the workability of the active matrix substrate 20 can be secured.

In addition, in the above embodiments, although the active matrix substrate in which the TFT, which is a three-terminal element, is provided as a thin film electrical element has been described by way of example, the present invention may also be applied, for example, to an active matrix substrate in which a two-terminal type thin film electrical element, such as a diode, using amorphous silicon is provided.

In addition, in the embodiments described above, although the active matrix substrate which uses silicon nitride films as the insulating films forming the underlayer film 11, the gate insulating film 13, and the protective film 16 has been described by way of example, the present invention may also be applied to an active matrix substrate in which, as the inorganic insulating films, a silicon oxide film and a silicon nitride film are used alone or in combination.

In addition, in the embodiments described above, although as the front surface-side resin film and the rear surface-side resin film, a transparent acrylic resin and a transparent polyimide resin have been described, respectively, by way of example, a reflective liquid crystal display device or a self-luminous display device may also be formed using an opaque resin as the front surface-side resin film and the rear surface-side resin film.

In addition, in the embodiments described above, although the liquid crystal display device has been described by way of example as a display device, the present invention may also be applied to other display devices, such as an organic EL (Electro Luminescence) display device, an electro wetting type display device, and an electrochromic type display device.

In addition, in the embodiments described above, although the liquid crystal display device has been described by way of example, the present invention may also be applied to a spatial light modulation element (such as a parallel information processing computing apparatus) which uses polarization of light and which is formed using, for example, a material having an electro-optical effect (such as KDP ($KH_2PO_4$) crystal, $LiTaO_3$, $LiNbO_3$, $Ba_2NaNb_5O_{15}$, or $Sr_{0.5}Ba_{0.5}Nb_2O_6$) instead of using a liquid crystal display material.

In addition, in the embodiments described above, although the active matrix substrate in which the electrode of the TFT connected to the pixel electrode is used as the drain electrode has been described by way of example, the present invention may also be applied to an active matrix substrate in which the electrode of the TFT connected to the pixel electrode is called a source electrode.

INDUSTRIAL APPLICABILITY

As has thus been described, since the warpage of the active matrix substrate using a resin substrate can be suppressed, the present invention is advantageously applied to a display device of an electronic book, an electronic notebook, an electronic newspaper, a digital signage (electronic signage), or the like.

REFERENCE SIGNS LIST

5 TFT (thin film electrical element)
8 rear surface-side resin film
9 rear surface-side inorganic film
10 first resin substrate
11 underlayer film (front surface-side inorganic film)
12a gate electrode
13 gate insulating film (front surface-side inorganic film)
14 semiconductor layer
16 protective film (front surface-side inorganic film)
17 planarizing film (front surface-side resin film)
20 active matrix substrate
40 counter substrate
50 liquid crystal layer (display medium layer)
60a to 60c liquid crystal display device

The invention claimed is:

1. An active matrix substrate comprising:
a resin substrate having a heat resistance;
a thin film electrical element provided at a front surface side of the resin substrate;
a plurality of front surface-side inorganic films which are formed from the same material and which are provided as different layers from each other at the front surface side of the resin substrate; and
a rear surface-side inorganic film which is formed from the same material as that of each of the front surface-side inorganic films and which is provided at a rear surface side of the resin substrate, wherein
the thickness of the rear surface-side inorganic film is set in a predetermined range with respect to the total thickness of the plurality of front surface-side inorganic films so that the curvature diameter calculated based on the linear elastic modulus, the coefficient of linear expansion, and the thickness of the resin substrate; the linear elastic moduli, the coefficients of linear expansion, and the total thickness of the plurality of front surface-side inorganic films; and the linear elastic modulus, the coefficient of linear expansion, and the thickness of the rear surface-side inorganic film is 20 mm or more or −20 mm or less,
the resin substrate is formed of a polyimide resin,
the front surface-side inorganic films are each a silicon nitride film, and
when the total thickness of the plurality of front surface-side inorganic films is represented by $X_a$ μm, a thickness $Y_a$ μm of the rear surface-side inorganic film satisfies the following relational expression $$-0.1263X_a^2+0.674X_a+0.0733 \le Y_a \le 25.321X_a^3-49.8X_a^2+34.76X_a-7.355.$$

2. The active matrix substrate according to claim 1, further comprising a front surface-side resin film for planarizing a substrate surface at the front surface side of the resin substrate.

3. The active matrix substrate according to claim 2, further comprising a rear surface-side resin film having a heat resistance at the rear surface side of the resin substrate,
wherein the thickness of the rear surface-side resin film is set in a predetermined range with respect to the thickness of the front surface-side resin film so that the curvature diameter calculated based on the linear elastic modulus, the coefficient of linear expansion, and the thickness of the resin substrate; the linear elastic moduli, the coefficients of linear expansion, and the total thickness of the plurality of front surface-side inorganic films; the linear elastic modulus, the coefficient of linear expansion, and the thickness of the rear surface-side inorganic film; the linear elastic modulus, the coefficient of linear expansion, and the thickness of the front surface-side resin film; and the linear elastic modulus, the coefficient of linear expansion, and the thickness of the rear surface-side resin film is 20 mm or more or −20 mm or less.

4. The active matrix substrate according to claim 3,
wherein the front surface-side resin film is formed from an acrylic resin to have a thickness of $X_b$ μm,
the rear surface-side resin film is formed from a polyimide resin to have a thickness of $Y_b$ μm, and
when the total thickness of the resin substrate, the front surface-side inorganic films, and the rear surface-side inorganic film is represented by $X_c$ μm, the thickness $Y_b$ of the rear surface-side resin film satisfies the following relational expression $$(-0.045X_b^2+1.4939X_b-1.9462)(-0.0348X_c^2+0.1518X_c+1.4817) \le Y_b \le (0.0173X_b^2+0.8303X_b+1.4109)(0.0073X_c^2-0.0011X_c+0.7038).$$

5. The active matrix substrate according claim 1,
wherein the thin film electrical element is a thin film transistor including a gate electrode and a semiconductor layer, and
the plurality of front surface-side inorganic films includes an underlayer film provided on the front surface of the resin substrate, a gate insulating film provided between the gate electrode and the semiconductor layer, and a protective film provided so as to cover the thin film transistor.

6. The active matrix substrate according claim 1,
wherein the resin substrate has transparency.

7. The active matrix substrate according to claim 3,
wherein the front surface-side resin film and the rear surface-side resin film each have transparency.

8. A display device comprising:
the active matrix substrate according to claim 1;
a counter substrate provided to face a front surface side of the active matrix substrate at which the thin film electrical element is provided; and
a display medium layer provided between the active matrix substrate and the counter substrate.

9. The display device according to claim 8,
wherein the display medium layer is a liquid crystal layer.

10. An active matrix substrate comprising:
a resin substrate having a heat resistance;
a thin film electrical element provided at a front surface side of the resin substrate;
a plurality of front surface-side inorganic films which are formed from the same material and which are provided as different layers from each other at the front surface side of the resin substrate; and
a rear surface-side inorganic film which is formed from the same material as that of each of the front surface-side inorganic films and which is provided at a rear surface side of the resin substrate,
wherein the thickness of the rear surface-side inorganic film is set in a predetermined range with respect to the total thickness of the plurality of front surface-side inorganic films so that the curvature diameter calculated based on the linear elastic modulus, the coefficient of linear expansion, and the thickness of the resin substrate; the linear elastic moduli, the coefficients of linear expansion, and the total thickness of the plurality of front surface-side inorganic films; and the linear elastic modulus, the coefficient of linear expansion, and the thickness of the rear surface-side inorganic film is 20 mm or more or −20 mm or less, the active matrix substrate further includes a front surface-side resin film for planarizing a substrate surface at the front surface side of the resin substrate, and a rear surface-side resin film having a heat resistance at the rear surface side of the resin substrate, the thickness of the rear surface-side resin film is set in a predetermined range with respect to the thickness of the front surface-side resin film so that the curvature diameter calculated based on the linear elastic modulus, the coefficient of linear expansion, and the thickness of the resin substrate; the linear elastic moduli, the coefficients of linear expansion, and the total thickness of the plurality of front surface-side inorganic films; the linear elastic modulus, the coefficient of linear expansion, and the thickness of the rear surface-side inorganic film; the linear elastic modulus, the coefficient of linear expansion, and the thickness of the front surface-side resin film; and the linear elastic modulus, the coefficient of linear expansion, and the thickness of the rear surface-side resin film is 20 mm or more or −20 mm or less, the front surface-side resin film is formed from an acrylic resin to have a thickness of $X_b$ μm, the rear surface-side resin film is formed from a polyimide resin to have a thickness of $Y_b$ μm, and when the total thickness of the resin substrate, the front surface-side inorganic films, and the rear surface-side inorganic film is represented by $X_c$ μm, the thickness $Y_b$ of the rear surface-side resin film satisfies the following relational expression $$(-0.045X_b^2+1.4939X_b-1.9462)(-0.0348X_c^2+0.1518X_c+1.4817) \le Y_b \le (0.0173X_b^2+0.8303X_b+1.4109)(0.0073X_c^2-0.0011X_c+0.7038).$$

11. The active matrix substrate according to claim 10,
wherein the thin film electrical element is a thin film transistor including a gate electrode and a semiconductor layer, and
the plurality of front surface-side inorganic films includes an underlayer film provided on the front surface of the resin substrate, a gate insulating film provided between the gate electrode and the semiconductor layer, and a protective film provided so as to cover the thin film transistor.

12. The active matrix substrate according to claim 10,
wherein the resin substrate has transparency.

13. The active matrix substrate according to claim 10,
wherein the front surface-side resin film and the rear surface-side resin film each have transparency.

14. A display device comprising:
the active matrix substrate according to claim 10;
a counter substrate provided to face a front surface side of the active matrix substrate at which the thin film electrical element is provided; and
a display medium layer provided between the active matrix substrate and the counter substrate.

15. The display device according to claim 14,
wherein the display medium layer is a liquid crystal layer.

* * * * *